United States Patent
Lin et al.

(10) Patent No.: US 12,268,023 B2
(45) Date of Patent: Apr. 1, 2025

(54) DEVICES WITH IMPROVED OPERATIONAL CURRENT AND REDUCED LEAKAGE CURRENT

(71) Applicant: Taiwan Semiconductor Manufacturing Company, Ltd., Hsinchu (TW)

(72) Inventors: Po-Yu Lin, Hsinchu (TW); Tzu-Hua Chiu, Hsinchu (TW); Wei-Yang Lee, Taipei (TW); Chia-Pin Lin, Hsinchu County (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 768 days.

(21) Appl. No.: 17/462,869

(22) Filed: Aug. 31, 2021

(65) Prior Publication Data

US 2023/0063612 A1  Mar. 2, 2023

(51) Int. Cl.

| | |
|---|---|
| *H01L 29/06* | (2006.01) |
| *H01L 29/423* | (2006.01) |
| *H01L 29/66* | (2006.01) |
| *H01L 29/786* | (2006.01) |
| *H10D 30/01* | (2025.01) |
| *H10D 30/67* | (2025.01) |
| *H10D 62/10* | (2025.01) |
| *H10D 64/01* | (2025.01) |

(52) U.S. Cl.
CPC ......... *H10D 62/121* (2025.01); *H10D 30/031* (2025.01); *H10D 30/6713* (2025.01); *H10D 30/6735* (2025.01); *H10D 30/6757* (2025.01); *H10D 64/018* (2025.01)

(58) Field of Classification Search
CPC .......... H01L 29/0673; H01L 29/42392; H01L 29/66553; H01L 29/66742; H01L 29/78618; H01L 29/78696; H01L 29/66439; H01L 29/1079; H01L 29/0847; H01L 29/41766; H01L 29/775; H01L 29/165; H01L 29/665; H01L 29/7848; H01L 29/66545; B82Y 10/00
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |

(Continued)

*Primary Examiner* — Kyoung Lee
*Assistant Examiner* — Sophia W Kao
(74) *Attorney, Agent, or Firm* — Haynes and Boone, LLP

(57) ABSTRACT

A semiconductor device includes a source/drain feature over a semiconductor substrate, channel layers connected to the source/drain feature, a gate structure between adjacent channel layers and wrapping the channel layers, and an inner spacer between the source/drain feature and the gate structure and between adjacent channel layers. The source/drain feature has a first interface with a first channel layer of the channel layer. The first interface has a convex profile protruding towards the first channel layer.

20 Claims, 23 Drawing Sheets

(56) References Cited

U.S. PATENT DOCUMENTS

| | | | |
|---|---|---|---|
| 9,245,805 B2 | 1/2016 | Yeh et al. | |
| 9,520,482 B1 | 12/2016 | Chang et al. | |
| 9,576,814 B2 | 2/2017 | Wu et al. | |
| 9,741,811 B2 * | 8/2017 | Hatcher | H01L 27/0886 |
| 11,251,313 B2 * | 2/2022 | Kang | H01L 21/02532 |
| 11,393,929 B2 * | 7/2022 | Yang | H01L 29/1033 |
| 2018/0294331 A1 * | 10/2018 | Cho | H01L 29/0649 |
| 2019/0287864 A1 * | 9/2019 | Cheng | H01L 21/823468 |
| 2019/0341450 A1 * | 11/2019 | Lee | H01L 21/823864 |
| 2022/0352036 A1 * | 11/2022 | Young | H01L 29/0673 |

* cited by examiner

DEVICES WITH IMPROVED OPERATIONAL CURRENT AND REDUCED LEAKAGE CURRENT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nano-sheet-based transistor, whose gate structure extends around its channel region providing access to the channel region on all sides. The nano-sheet-based transistors are compatible with conventional metal-oxide-semiconductor (MOS) processes, allowing them to be aggressively scaled down while maintaining gate control and mitigating SCEs. However, conventional methods for mitigating leakage current in nano-sheet-based transistors may lead to increased resistances thereby suffering reduced performance. Therefore, although conventional nano-sheet-based transistors have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
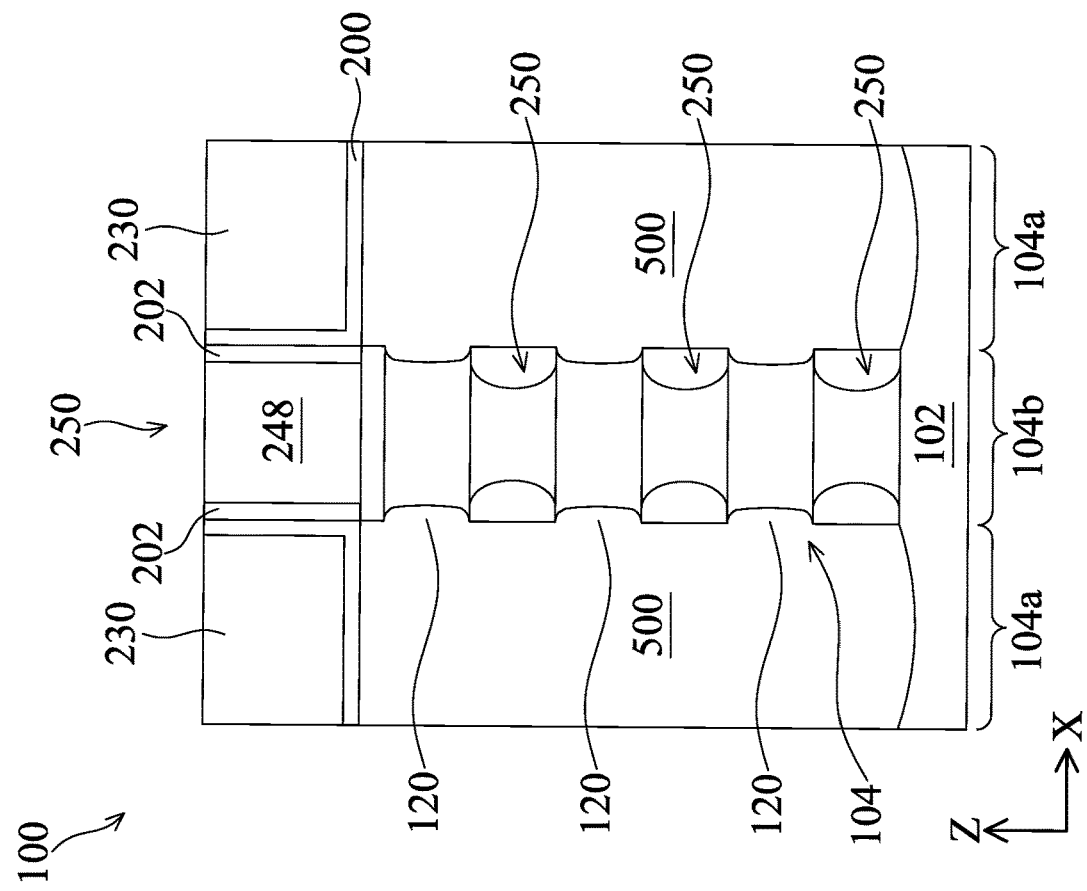
FIG. 1B is a cross-sectional view of an embodiment of a nano-sheet-based device of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about." "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are referred to as nano-sheet-based transistors (or interchangeably nano-sheet-based devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on).

Sometimes, nano-sheet-based devices include source/drain features that extend into the semiconductor substrate. The lower portions of the source/drain features (referred to herein as the sub-channel region) are interposed by a region of the semiconductor substrate that may function as a channel in operation. This region of the semiconductor substrate is referred to herein as the bottom channel. Unlike higher channels (also referred to as the channels, suspended channel layers, etc. as described in further details below) that are surrounded by portions of gate structure in 360°, the sub-channel region is only controlled by a portion of gate structure from its top surface. As a result, the gate control of this region is much weaker as compared to higher channels. The bottom channel may therefore suffer from leakages where the charge carriers migrate between sub-channel regions of the source/drain features through the bottom channel. To mitigate such leakages, it may be useful to implement a multilayer source/drain feature structure. For example, the source/drain features may each include a first source/drain layer that has dopants at a low concentration, and a second source/drain layer that has dopants at a high concentration. The first source/drain layer occupies the entirety of the sub-channel regions. As charge carriers migrate at a relatively slow speed through the first source/drain layer due to the lower concentration of dopants, leakage current is reduced. In many instances, however, the first source/drain layer are also present on side surfaces of the source/drain features that interface with the higher channels. Accordingly, the first source/drain layer not only reduces the migration speeds of the charge carriers at the interface between the source/drain feature with the substrate that causes the leakage, but also similarly reduces the migration speed of the charge carriers at the interfaces between the source/drain feature with the higher channel layers. This unintentionally and adversely affects the operational speeds of the device. The present disclosure provides methods that mitigate the adverse effects of the first source/drain layer adjacent the higher channel without forgoing the benefits in the reduction of OFF-state leakage. For example, the end portions of the higher channels are laterally etched such that the channel length is reduced. Moreover, the etched higher channel have concave sidewall surfaces. Accordingly, the first source/drain layer formed thereon has a convex sidewall surface profile protruding towards the higher channels. As described in more detail below, this improves the carrier migration speeds in the higher channels without negating any benefits achieved towards reducing the OFF-state leakage. Performance improvements are thus achieved. The nano-sheet based devices presented herein may be an n-type metal-oxide-semiconductor (NMOS) device, a p-type metal-oxide-semiconductor (PMOS) device, or a complementary metal-oxide-semiconductor (CMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figure 1A:
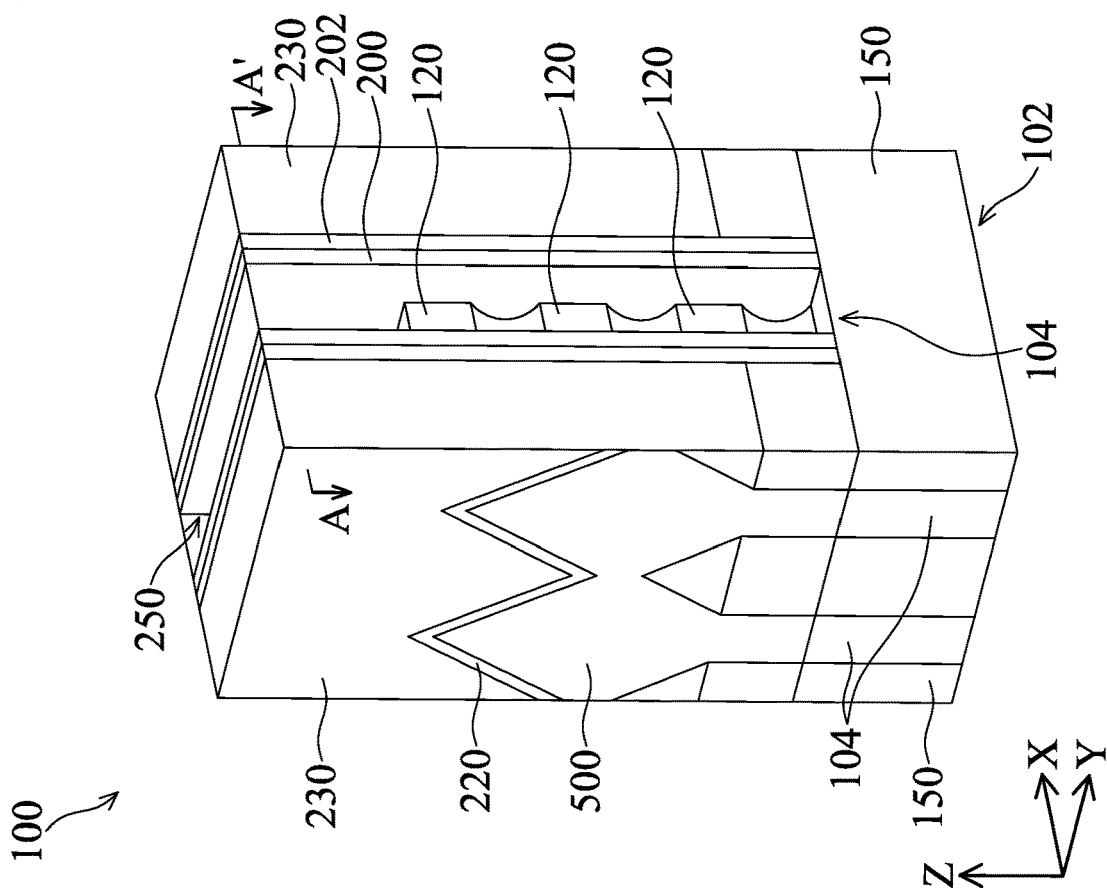
FIG. 1A is a three-dimensional (3D) perspective view of an embodiment of a nano-sheet-based device of the present disclosure constructed according to some embodiments of the present disclosure.

An example nano-sheet-based transistor 100 (or nano-sheet-based device 100, or device 100) is illustrated in FIGS. 1A and 1B. FIG. 1A is a three-dimensional (3D) perspective view of an embodiment of device 100 that may be implemented as an NMOS device, a PMOS device, or part of a CMOS device, according to embodiments of the present disclosure. FIG. 1B is a cross-sectional view of the device 100 of FIG. 1A along the line A-A'. FIGS. 1A and 1B are provided for better visualization and understanding of features subsequently described in cross-sectional views. FIGS. 1A and 1B have been abbreviated and may not include all features described in detail later. As illustrated, the device 100 includes a semiconductor substrate (or substrate) 102. Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a stack of suspended semiconductor layers 120 (also interchangeably referred to as "semiconductor layers 120," "suspended channel layers 120," "channel layers 120," "channels 120," or "higher channels 120") in the channel region 104b of the fin structures 104 and the stack extends vertically (e.g. along the Z-direction) from the substrate 102. Each of the suspended semiconductor layers 120 connects a pair of epitaxial source/drain features 500. The suspended semiconductor layers 120 may each be in one of many different shapes, such as wire (or nanowire), sheet (or nanosheet), bar (or nanobar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Note that the gate structure 250 is illustrated as a transparent feature in FIG. 1A in order to illustrate the features (such as the semiconductor layers 120) that the gate structure 250 covers. FIGS. 1A and 1B have been abbreviated to provide a general picture of the device 100, and do not include all details. Additional details of the fin structures 104, the epitaxial source/drain features 500, and the gate structures 250 are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the fin structure 104 is located above the top surface of the isolation features 150. In the depicted embodiment, the device 100 further includes gate spacer layers 202 on both sides of the gate structures 250; contact etch stop layers 220 over the epitaxial source/drain features 500; and interlayer dielectric (ILD) layer 230 over the epitaxial source/drain features 500 and over the contact etch stop layers 220.

Figure 2A:
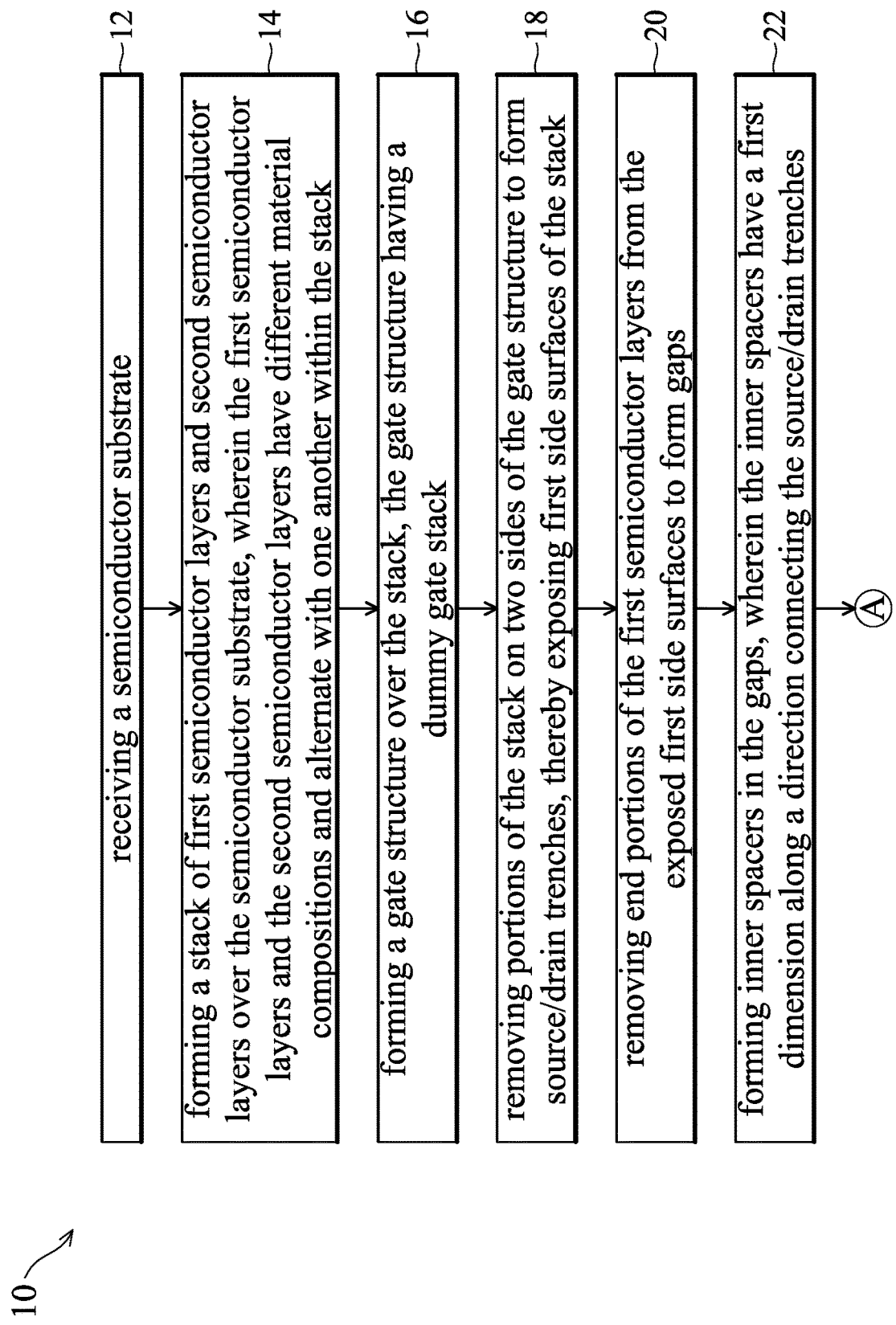
FIGS. 2A and 2B are flow charts of an example method for fabricating an embodiment of a nano-sheet-based devices of the present disclosure according to some embodiments of the present disclosure.
Figure 2B:
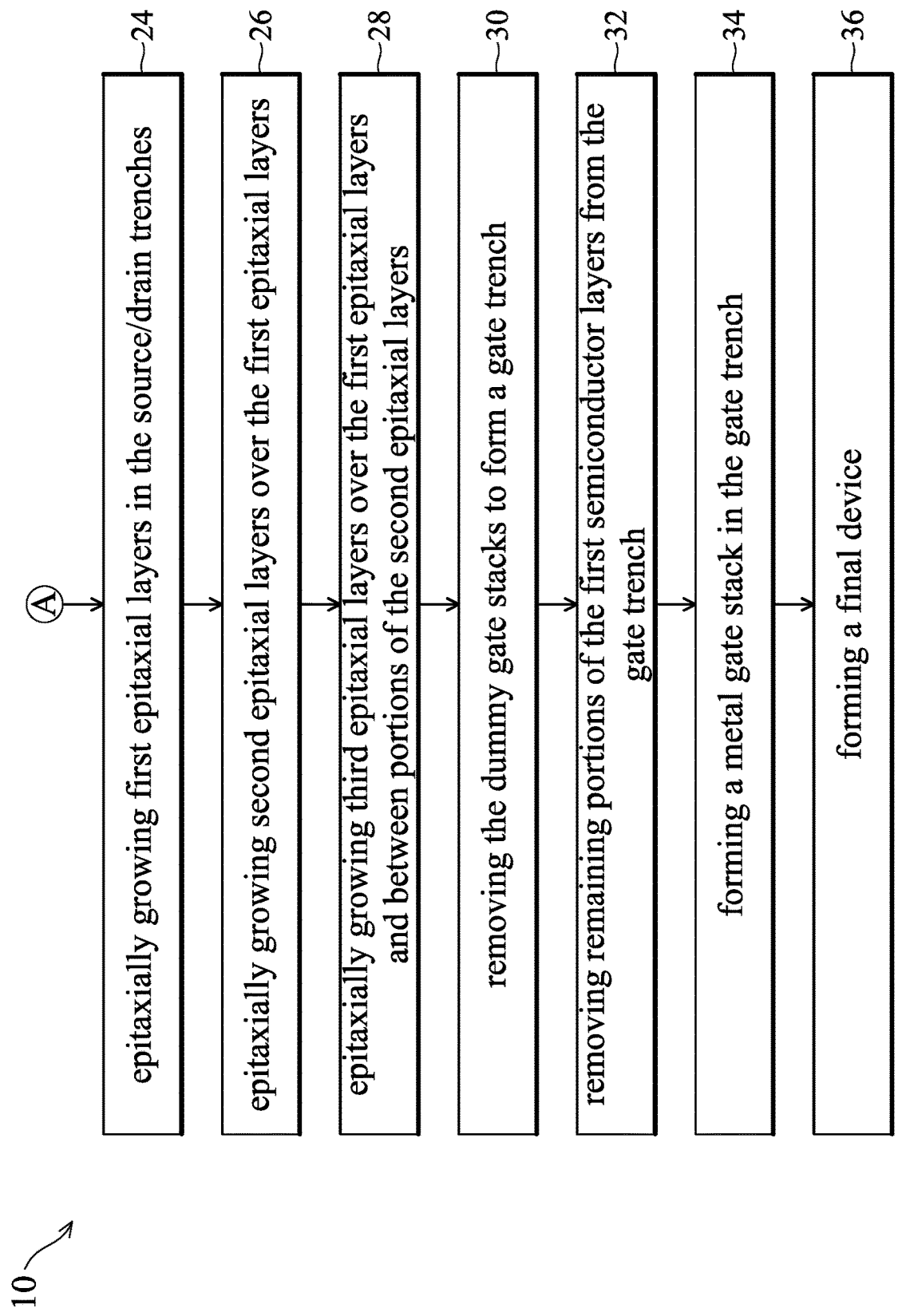

FIGS. 2A-2B are flow charts illustrating an example method 10 for fabricating a device 100 of the present disclosure according to some embodiments of the present disclosure. FIGS. 3-9, 10, 10', 11, 11', 12, 12', 14, 15, and 15' are cross-sectional views of the device along the line A-A' in FIG. 1A constructed at various fabrication stages according to embodiments of the method 10. FIGS. 13A and 13B are expanded cross-sectional views of a portion of the device of FIG. 12; and FIGS. 13A' and 13B' are expanded cross-sectional views of a portion of the device of FIG. 12'.

Figure 3:
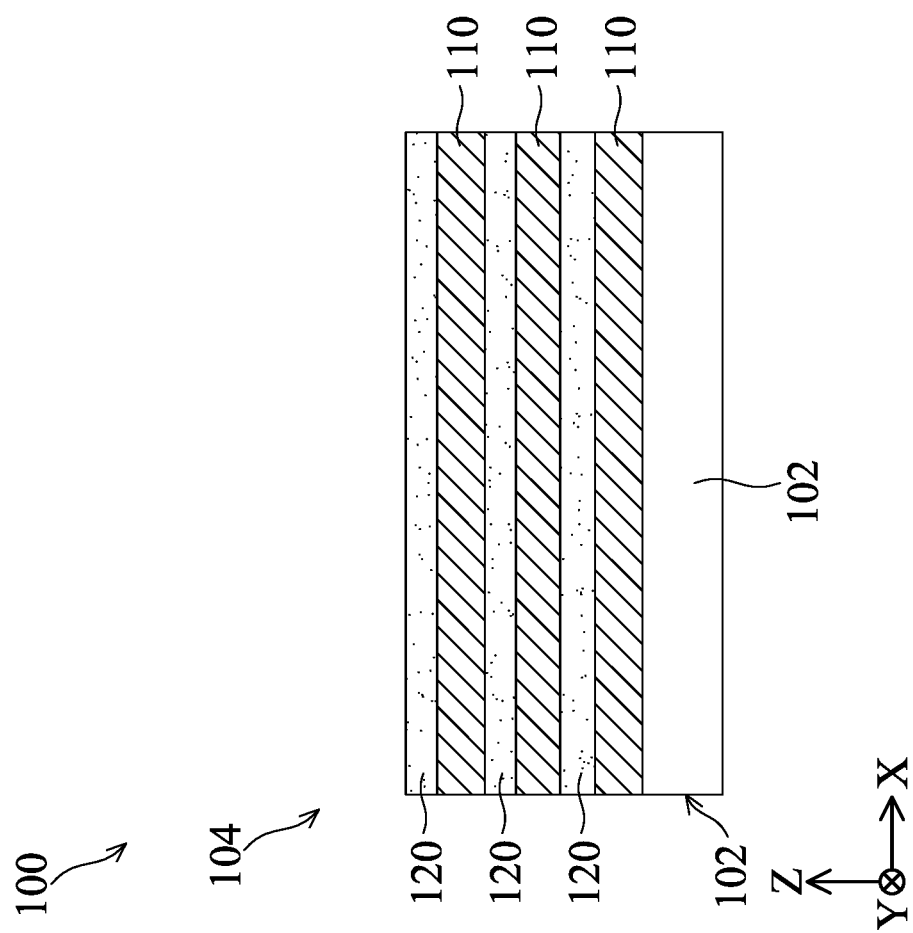
FIGS. 3, 4, 5, 6, 7, 8, 9, 10, 10', 11, 11', 12, 12', 14, 15, and 15' are cross-sectional views of embodiments of nano-sheet-based devices of the present disclosure along the line A-A' in FIG. 1A constructed at various fabrication stages according to some embodiments of the present disclosure.

Referring to block 12 of FIG. 2A and FIG. 3, the device 100 includes a substrate 102. The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below illustrate the fabrication of an NMOS device 100 as an example. The same or similar methods may be implemented for PMOS devices or CMOS devices.

Referring to block 14 of FIG. 2A and FIG. 3, a stack of semiconductor layers is formed over the substrate 102. The stack of semiconductor layers includes semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in the depicted embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet some other embodiments, the semiconductor layers 120 and 110 both contain SiGe, but have different Ge atomic concentrations. The semiconductor layers 110 may each have a same or different thickness from each other, and from thickness(es) of the semiconductor layers 120.

The stacks of semiconductor layers are patterned into a plurality of fin structures 104 such that they each extend along the X-direction. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

Figure 4:
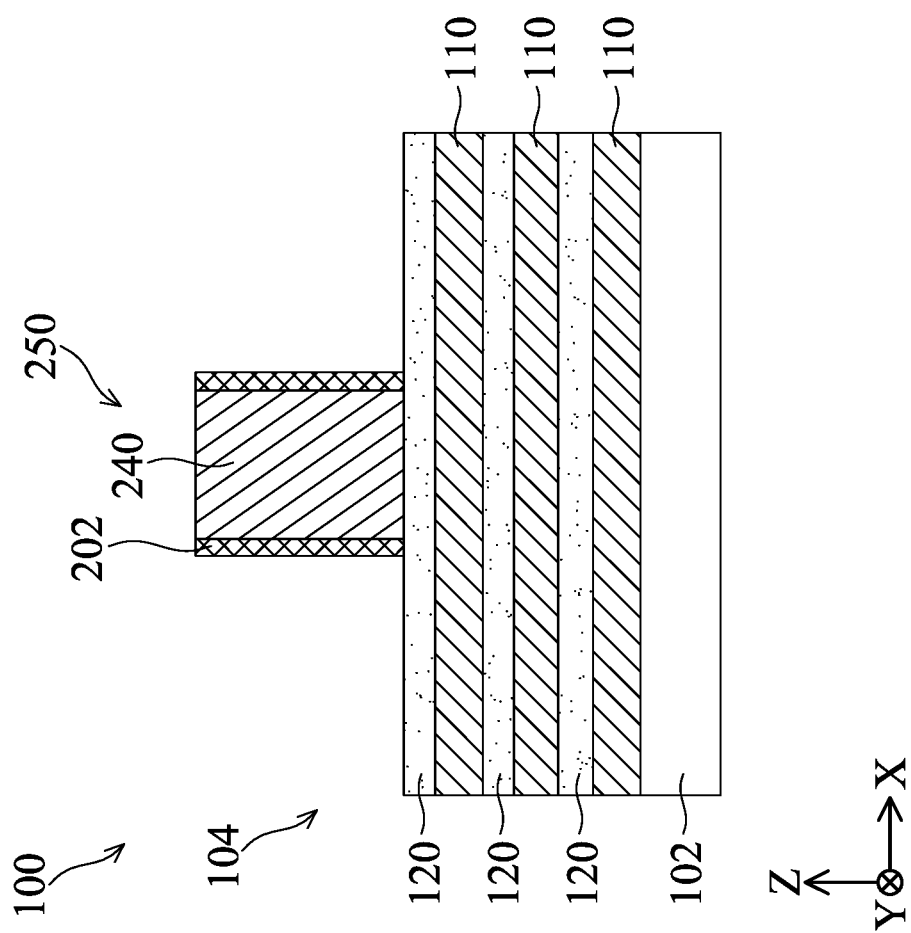

Referring to block 16 of FIG. 2A and FIG. 4, gate structures 250 are formed over a portion of each of the fin structures 104. In some embodiments, the gate structures 250 are also formed over the isolation features 150 in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy electrode layer, as well as one or more hard mask layers used to pattern the dummy gate electrode layer. In some embodiments, the dummy electrode layer includes polysilicon. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Gate spacers 202 are formed on the sidewalls of the dummy gate stacks 240. In the depicted embodiment, a gate spacer layer 202 is formed over the top surface of the device. The gate spacer layers 202 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacers 202 may include multiple sub-layers each having a different material. In some embodiments, the gate spacer layers 202 may have a thickness in the range of a few nanometers (nm). In some embodiments, the gate spacer layers 202 may be formed by depositing a spacer layer (containing the dielectric material) over the dummy gate stacks 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 202. In some embodiments, the anisotropic etching process is a dry (e.g. plasma) etching process. Additionally or alternatively, the formation of the gate spacer layers 202 may also involve chemical oxidation, thermal oxidation, ALD, CVD, and/or other suitable methods.

Figure 5:
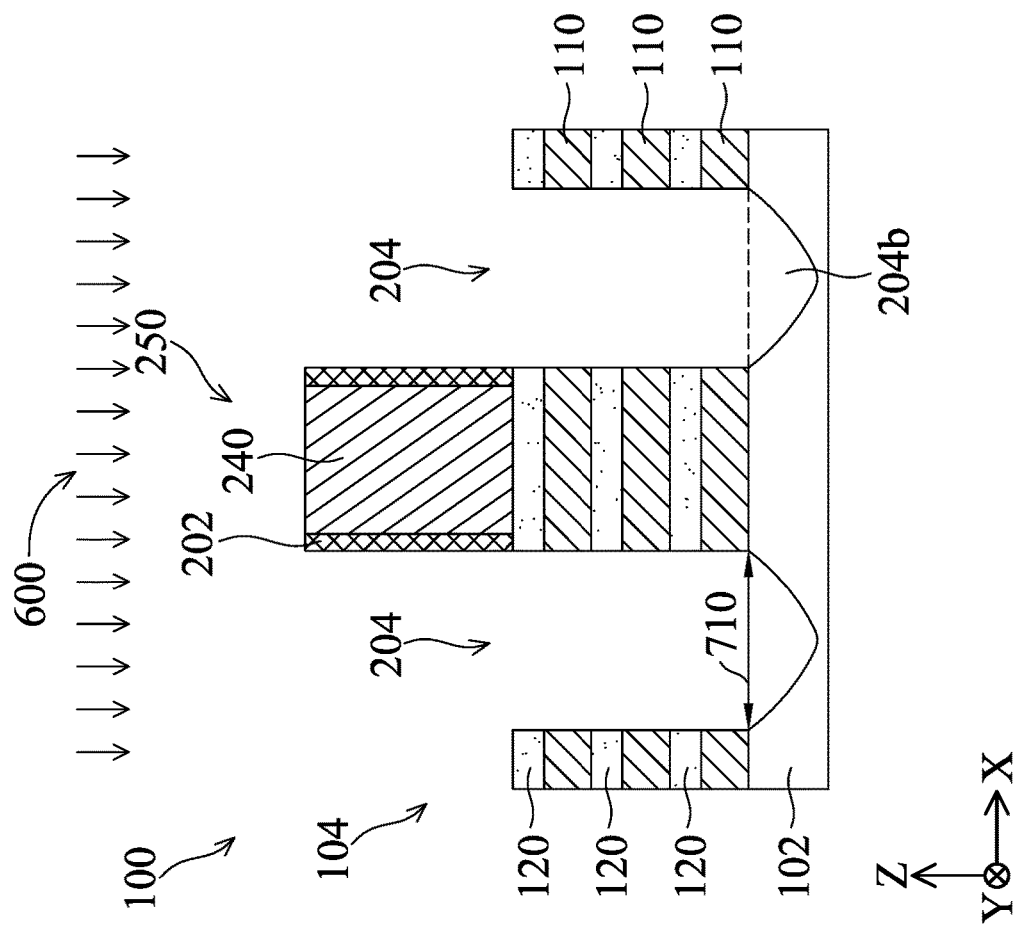

Referring to block 18 of FIG. 2A and FIG. 5, portions of the fin structure 104 adjacent to and exposed by the gate structures 250 (e.g. in the source/drain regions 104a, see FIGS. 1A and 1B) are at least partially recessed (or etched away) by process 600 to form the source/drain trenches 204. Meanwhile, the portions of the fin structure 104 underneath the gate structures 250 remain intact. Additional mask elements (such as photoresists) may also be employed to protect areas not designed to be removed during the process 600. In the depicted embodiment, the process 600 removes not only the exposed portions of fin structure 104, but also a portion of the underlying substrate 102. Accordingly, the source/drain trenches 204 extends below the top surface of the substrate 102. The bottom portion of the source/drain trenches 204 below the top surface of the substrate 102 are hereinafter referred to as trench portions 204b. The trench portions 204b are also below the lowest layer of subsequently formed channel layers. Accordingly, the trench portions 204b may be referred to as the "sub-channel" portion of the source/drain trench 204. The process 600 may include multiple lithography and etching steps, and may use any suitable methods, such as dry etching and/or wet etching. In some embodiments, the trenches 204b has a profile that resembles the "V" letter although the two prongs of the "V" may be curved, and the bottom of the "V" may be rounded. However, the present disclosure contemplates trench portions 204b that have any suitable profiles. In some embodiments, the top surface of the trench portions 204b may have a width 710 along the X-direction. This dimension determines the maximum width of the subsequently formed epitaxial layers in the trench portions 204b.

The formation of the source/drain trenches 204 exposes sidewalls of the stack of semiconductor layers 110 and 120. Referring to block 20 of FIG. 2B and FIG. 6, portions of the semiconductor layers 110 are removed through the exposed sidewall surfaces in the source/drain trenches 204 via a selective etching process, such as process 620. Because process 620 recesses the semiconductor layers 110 in a lateral direction along the X-direction, process 620 may sometimes be referred to as a lateral etching process, or a lateral recessing process. The process 620 is designed to remove end portions of the semiconductor layers 110 but only minimally affect the semiconductor layers 120. For example, two end portions of the semiconductor layers 110 may be removed to form respective openings 205, while the end portions of the semiconductor layers 120 directly above and below the removed end portions of the semiconductor layers 110 (hence above and below the openings 205) are substantially preserved. Therefore, openings 205 are formed between the vertically adjacent semiconductor layers 120.

Figure 6:
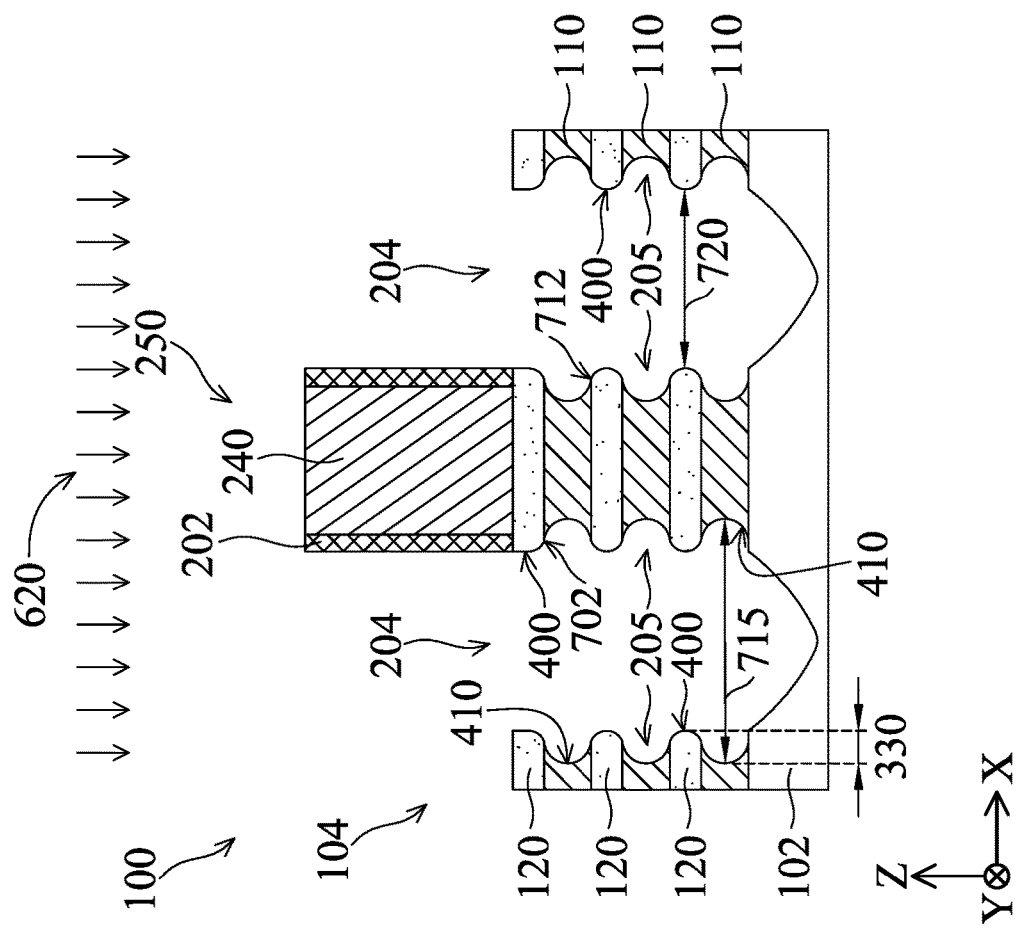

The openings 205 formed during the process 620 extend the source/drain trenches 204 into areas beneath and between the semiconductor layers 120 and under the gate spacer layers 202. The extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205 has a depth 330 along the X-direction. The depth 330 determines the upper limit of the lateral widths of inner spacers to be formed within the openings 205. In some embodiments, the etching process conditions cause the openings 205 to have curved surfaces. For example, as illustrated in FIG. 6, the remaining portions of the semiconductor layers 110 may have a concave surface 410 facing the openings 205. Accordingly, the openings 205 may have a larger width (along the X-direction) at its mid-height (along the Z-direction) than at its top or bottom interfaces with the semiconductor layers 120 or with the substrate 102. In the depicted embodiments, the width of the openings 205 at the mid-height is referred to as width 715. The width 715 is greater than width 710 (see FIG. 5). Moreover, the sidewall surfaces 410 meet the bottom surfaces of the semiconductor layers 120 at interface lines 702 (along the Y-direction), and meet the top surfaces of the semiconductor layers 120 (and the top surface of the substrate) at interface lines 712 (along the Y-direction).

The process 620 may be any suitable processes. In the depicted embodiments, the semiconductor layers 120 include Si and the semiconductor layers 110 include SiGe. The process 620 may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters.

Additionally, the sidewalls of the semiconductor layers 120 may also have curved surfaces after process 620 completes. As described above, although the semiconductor layers 120 are largely preserved during the process 620 due to their etching resistance to the etching chemical, they nevertheless may have their profiles slightly modified, particularly in their end portions above and below the openings 205. For example, prior to the process 620, these end portions may have substantially straight sidewall surfaces (see FIG. 5). After the process 620, the sidewall surfaces become more rounded and with a convex profile facing the source/drain trenches 204. The sidewall surface after the process 620 is referred to as surface 400. In other words, the semiconductor layers 120 may have a larger length along the X-direction at its mid-height (along the Z-direction) than at its top or bottom interfaces with the semiconductor layers 110 (and the openings 205). In some embodiments, opposing surfaces 400 of adjacent semiconductor layers 110 are separated by a distance (or separation) 720. In some embodiments, the separation 720 is about 40 nm to about 60 nm. In some approaches, the separation 720 determines a lateral dimension of a subsequently formed epitaxial layers. By contrast, as described in detail later, this present disclosure provides a subsequent etching process to further modify the semiconductor layers 120 to improve the device characteristics. As a result, the subsequently formed source/drain features have lateral dimensions greater than the separation 720 at the respective heights (for example, at the height along which the semiconductor layers 120 extend).

Figure 7:
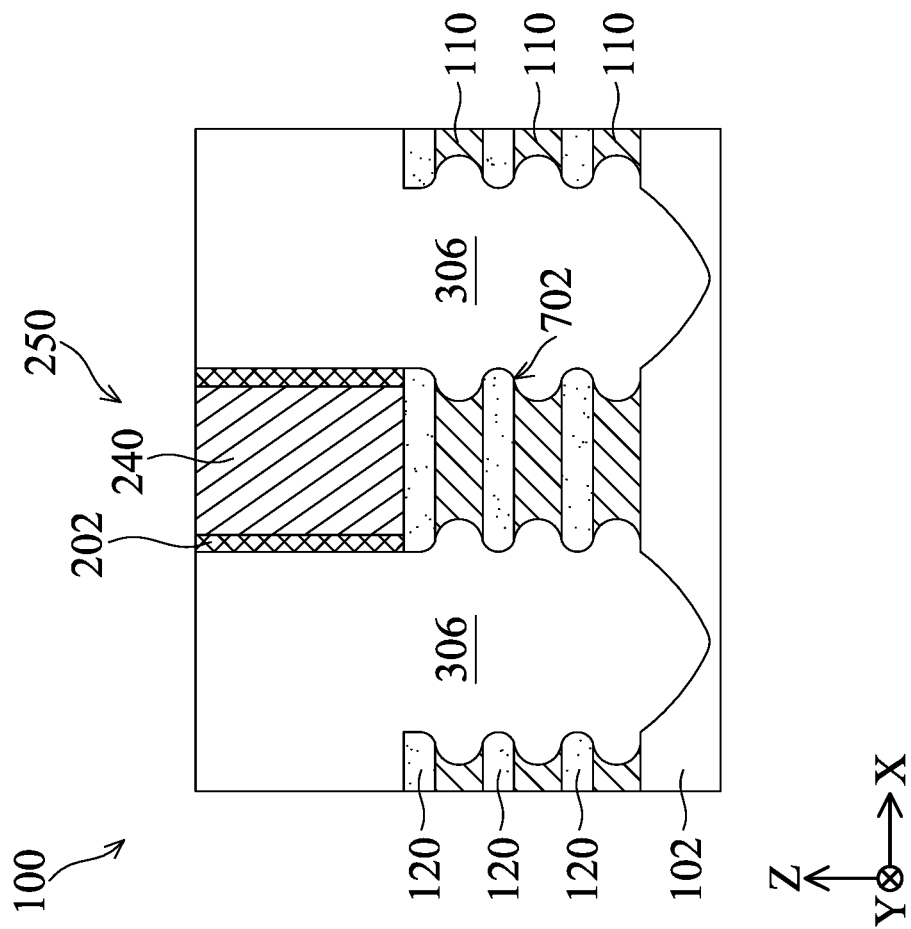

Referring to block 22 of FIG. 2A and FIG. 7, a dielectric material 306 is deposited into both the source/drain trenches 204 and the openings 205. In an embodiment, the dielectric material 306 may be selected from $SiO_2$, SiON, SiOC, SiOCN, or combinations thereof. In some embodiments, the proper selection of the dielectric material may be based on its dielectric constant. The deposition of the dielectric material 306 may be any suitable methods, such as CVD, PVD, PECVD, MOCVD, ALD, PEALD, or combinations thereof. In the depicted embodiment, the dielectric material 306 may have a top surface that extends along a top surface of the gate structure 250. For example, the dielectric material 306 may be deposited to a height over the top surface of the gate structure 250, and a CMP process may be performed to planarize the top surfaces of the device, and to expose the top surfaces of the gate structure 250.

Figure 8:
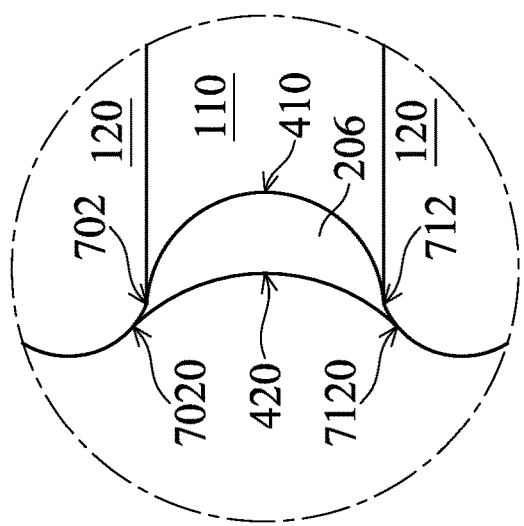
Figure 8:
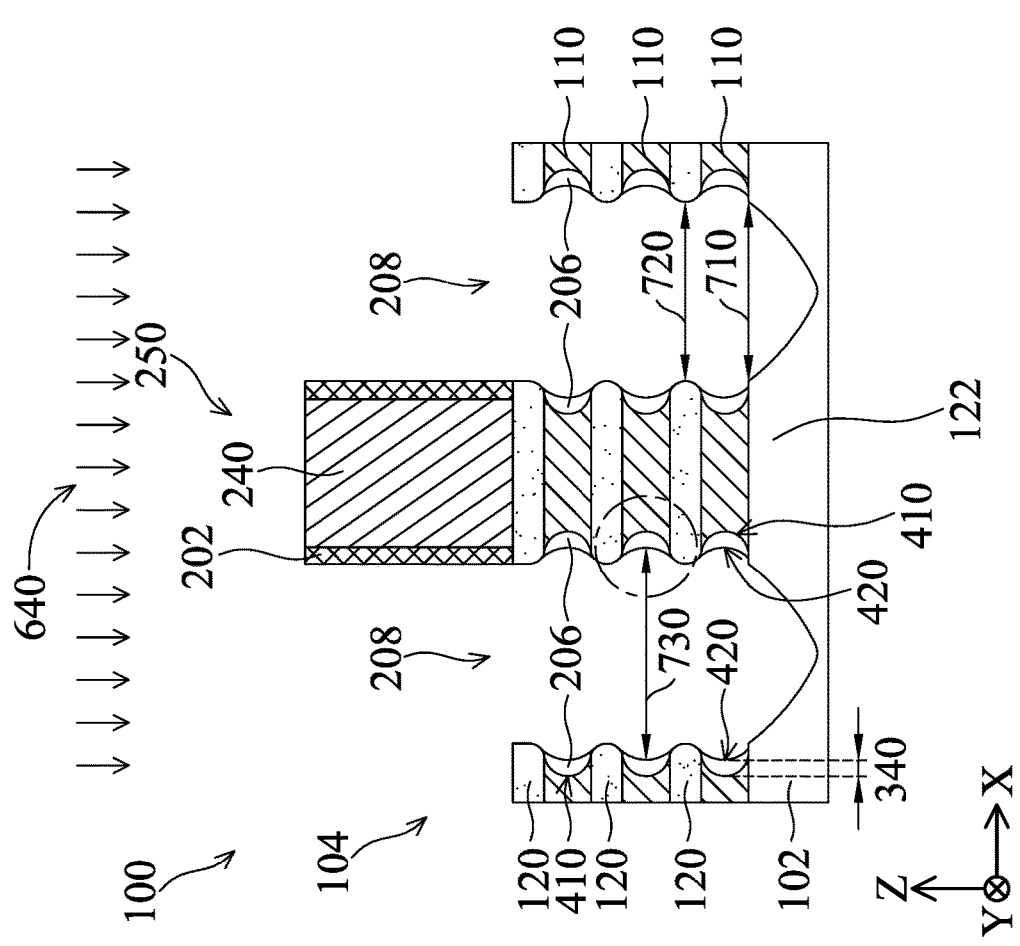

Referring to FIG. 8, the dielectric material 306 is partially etched back by process 640 to form new source/drain trenches 208. The partial etching-back completely removes the dielectric materials 306 within the original source/drain trenches 204, and removes a portion, but not all, of the dielectric materials 306 within the original openings 205 (compare FIG. 6). The dielectric materials 306 remaining in the openings 205 become the inner spacers 206. Accordingly, the inner spacers 206 are formed between vertically adjacent end portions of the semiconductor layers 120. Alternatively, a masking element may be used. The inner spacers 206 interface with the remaining portions of the semiconductor layers 110 at the surface 410. Additionally, the inner spacers 206 have a new surface 420 exposed in the source/drain trenches 208. The distance between the surfaces 410 and 420 defines the lateral width 340 of the inner spacers 206. The new surface 420 may be of a same or different profile as that of the surface 410. When the surfaces 410 and 420 have different profiles, the inner spacers 206 may have varying lateral widths at different heights of the inner spacers 206 along the Z-direction. In such embodiments, the lateral width 340 represents the maximum lateral width of the inner spacers 206, such as the lateral width along the X-direction at the their respective half-height along the Z-direction. In some embodiments, the separation 730 between two opposing surfaces 420 of adjacent inner spacers 206 define a lateral dimension of an epitaxial layer subsequently formed in the source/drain trenches 208. The separation 730 may be greater than the separation 720. In some embodiments, the separation 730 is about 50 nm to about 70 nm.

Moreover, as described above with respect to FIG. 6, the end portions of the semiconductor layers 120 have been modified in the process 620, resulting in convex sidewall surface profiles of the etched semiconductor layers 120. In the depicted embodiments, the inner spacers 206 are partially formed on the curved sidewall surfaces of the semiconductor layer 120. For example, the etching front of the process 640 does not reach interface lines 702 and 712 (see FIG. 7), therefore, does not entirely remove the portion of inner spacer materials 306 on the convex side surfaces. Rather the process 640 produces new interface lines 7020 and 7120 between the inner spacers 206 and the adjacent semiconductor layers 120. Accordingly, the inner spacers 206 may each have an area spanning between the interface line 702 and a new interface line 7020 that is formed on the bottom surface of an overlaying semiconductor layer 120; and the inner spacers 206 may further each have an area spanning between the interface line 712 and a new interface line 7120 that is formed on the top surface of an underlaying semiconductor layer 120. As a result, the inner spacers 206 extend into areas previously occupied by the unetched semiconductor layers 120. For example, inner spacers 206 extend onto the top surface of the convex sidewall surface of an underlaying semiconductor layers 120 from above, and extend onto the bottom surface of the convex sidewall surface of an overlaying semiconductor layer 120 from below. The middle section (along the Z-direction) of the semiconductor layers 120, however, are exposed. As a result, the inner spacers 206 may have a vertical height along the Z-direction that is greater than the height of the semiconductor layers 110. However, this present disclosure also contemplates embodiments where the process 640 reaches the interface lines 702, 712 and/or proceeds beyond the interface lines 702, 712.

Figure 9:
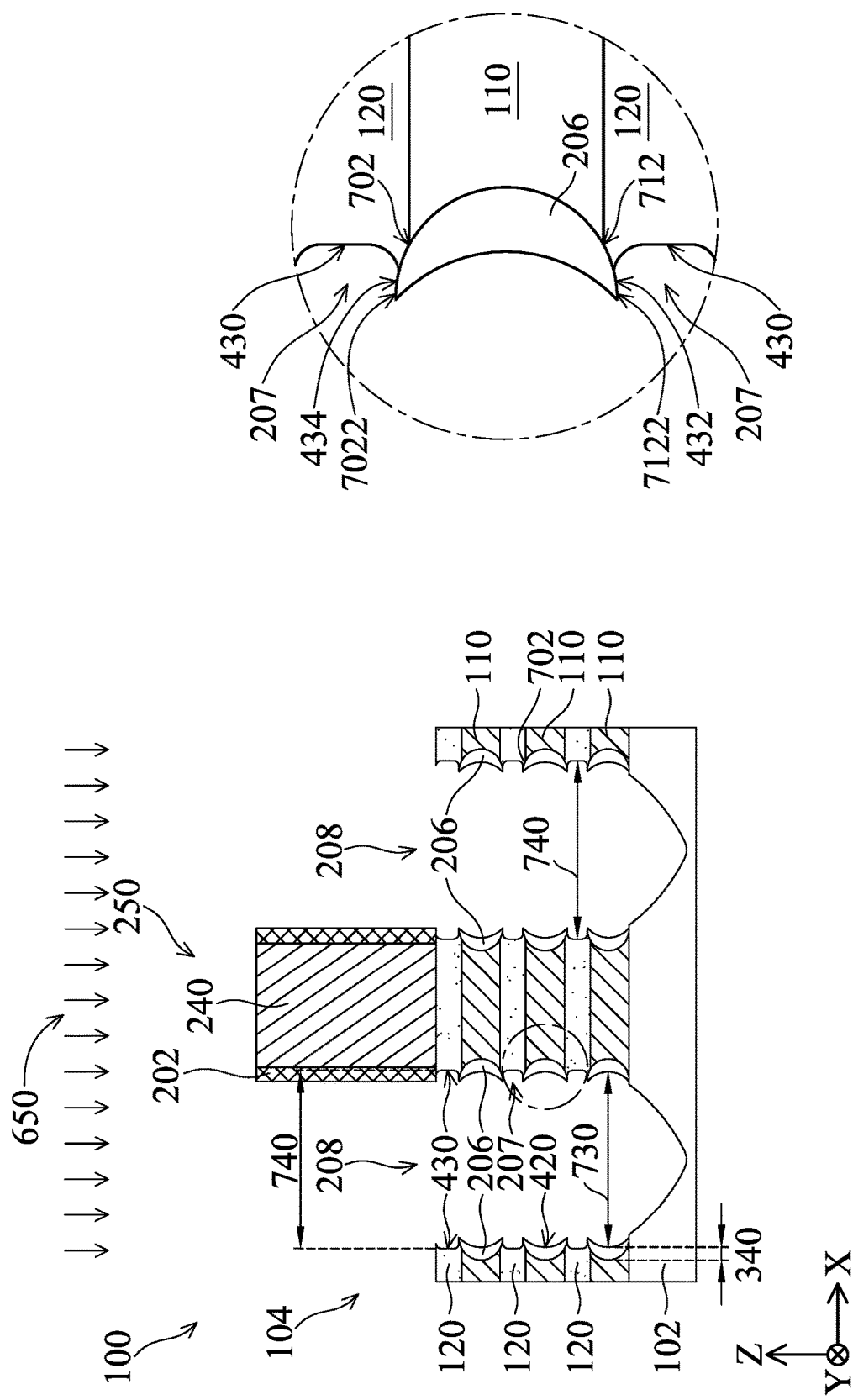

Referring to block 24 of FIG. 2B and FIG. 9, the semiconductor layers 120 are laterally etched in process 650 to form gaps on and between vertically adjacent inner spacers 206. The process 650 causes new sidewall surfaces 430 for the semiconductor layers 120 to be formed and exposed. In some embodiments, the process 650 removes a portion having a lateral width (for example, the lateral width at the half-height of the semiconductor layers 120) of about 0.5 nm to about 10 nm from both ends of the semiconductor layers 120. In some embodiments, the process removes a portion having a lateral width of about 1 nm to about 5 nm. If the removed portion is too large, such as having a lateral width greater than about 10 nm, the channel length may approach the depletion-layer widths of the source and drain junction, thereby causing short-channel effect (SCE) concerns. If the removed portion is too small, the increase in device speed may not be substantial enough to justify the extra processing cost. The sidewall surfaces 430 each have a concave sidewall surface facing the source/drain trenches 208. In other words, the process 650 alters the semiconductor layers 120, such that the previously convex sidewall surfaces 400 are replaced with concave sidewall surfaces 430. As a result of the process 650, the distance between opposing sidewall surfaces of adjacent etched semiconductor layers 120 increases. For example, prior to the process 650, the distance is the distance 720 (see FIG. 8); while after the process 650, the distance becomes the distance 740. The distance 740 is greater than the distance 720. In some embodiments, the difference between the distance 740 and the distance 720 (that is, twice the etched amount) is about 1 nm to about 20 nm. In some embodiments, the difference between the distance 740 and the distance 720 is about 2 nm to about 10 nm. In some embodiments, the distance 740 is controlled by adjusting an etching time duration. In some embodiments, the distance 740 determines the lateral width of the source/drain features subsequently formed at the respective height of the source/drain trenches 208. In some embodiments, the distance 740 and the distance 730 collectively determine the profile of the subsequently formed source/drain features. The distance 740 may be greater than distance 730. Accordingly, the source/drain features may have a wavy profile along the sidewall of the source/drain trenches 208.

Moreover, in the depicted embodiments, the process 650 etches beyond the interface lines 7020 and 7120, but does not reach the interface lines 702 and 712 (see FIG. 8). Accordingly, no portions of the semiconductor layers 110 are exposed to the etching chemicals. For example, the process 650 produces new interface lines 7022 and 7122 between the inner spacers 206 with the overlaying semiconductor layers 120, and with the underlaying semiconductor layers 120, respectively. In other words, the portion of the semiconductor layers 120 spanning between interface lines 7020 and 7022 and between the interface lines 7120 and 7122 are removed during the process 650. Accordingly, the process 650 further produces exposed openings 207 between vertically adjacent inner spacers 206. As a result, the process 650 extends the source/drain trenches 208 into areas above and below the inner spacers 206. The openings 207 are defined by the newly produced sidewall surfaces 430 of the etched semiconductor layers 120, newly exposed bottom surfaces 432 of the inner spacers 206, and newly exposed top surfaces 434 of the inner spacers 206. The profiles of the surfaces 430, 432, and 434 are described in detail later. In other embodiments, the process 650 may not reach the interface lines 7020, 7120 (see FIG. 8). In still other embodiments, the process 650 may etch beyond the interface lines 702 and 712 (see FIG. 8), such that the semiconductor layers 110 are partially exposed.

The process 650 may implement any suitable methods that etches the semiconductor layers 120 without affecting the inner spacers 206. In embodiments where the semiconductor layers 110 are partially exposed, the process 650 may be designed to selectively etch the semiconductor layers 120 without substantially etching the semiconductor layers 110 or the inner spacers 206. For example, the process 650 may implement a cryogenic deep reactive ion etching (DRIE). In some embodiments, the DRIE process may implement a sulfur hexafluoride-oxygen ($SF_6$-$O_2$) plasma.

Figure 10:
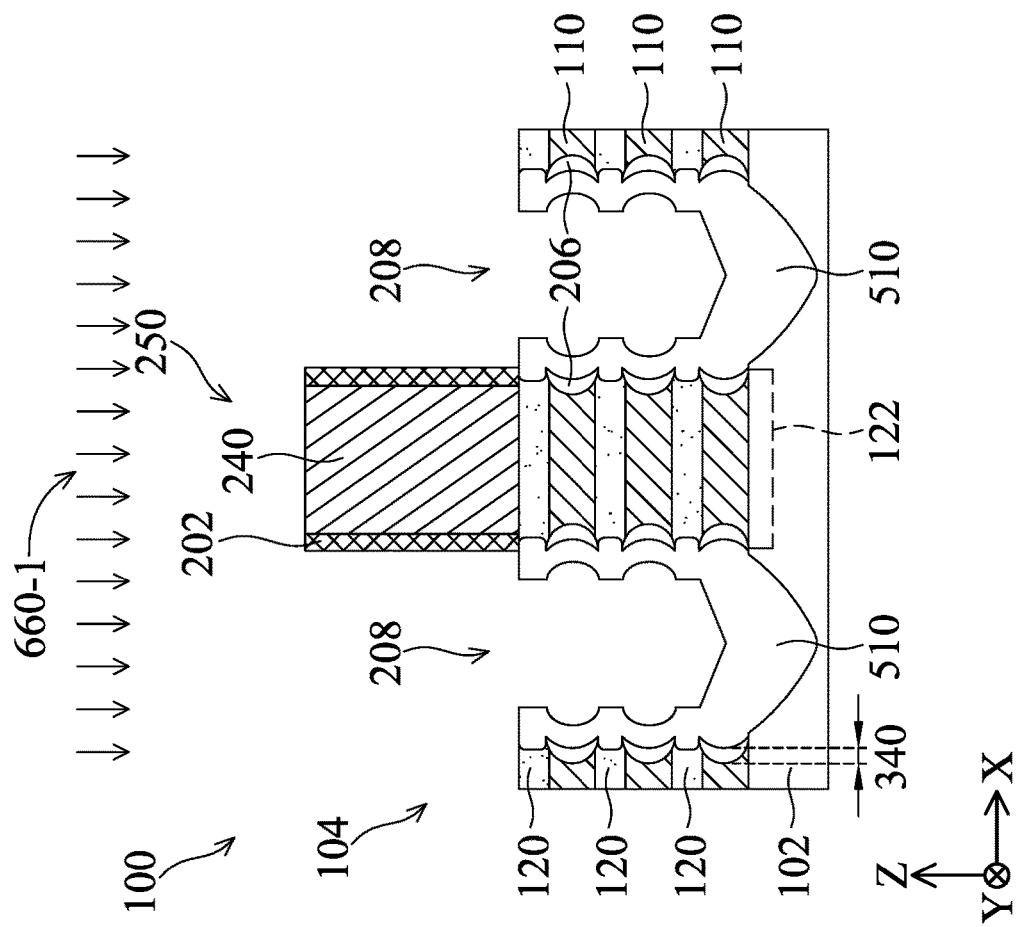
Figure 10:
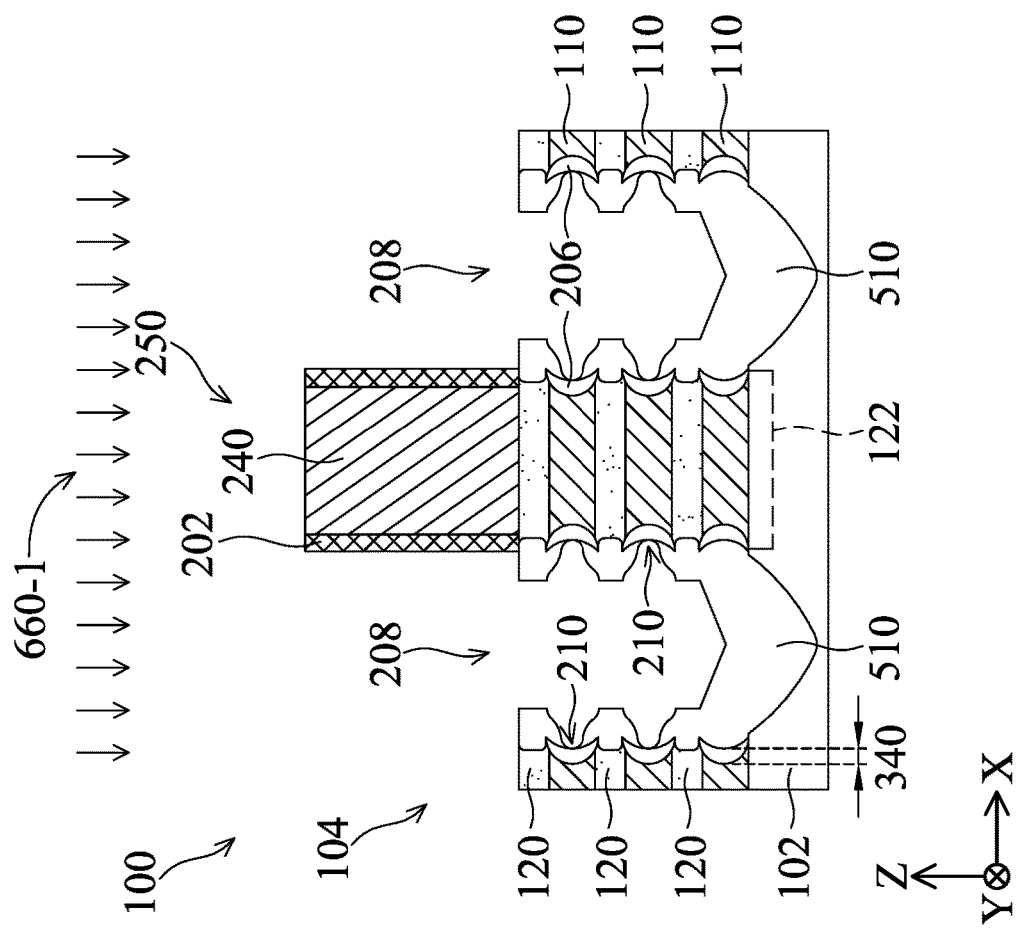
Figure 11:
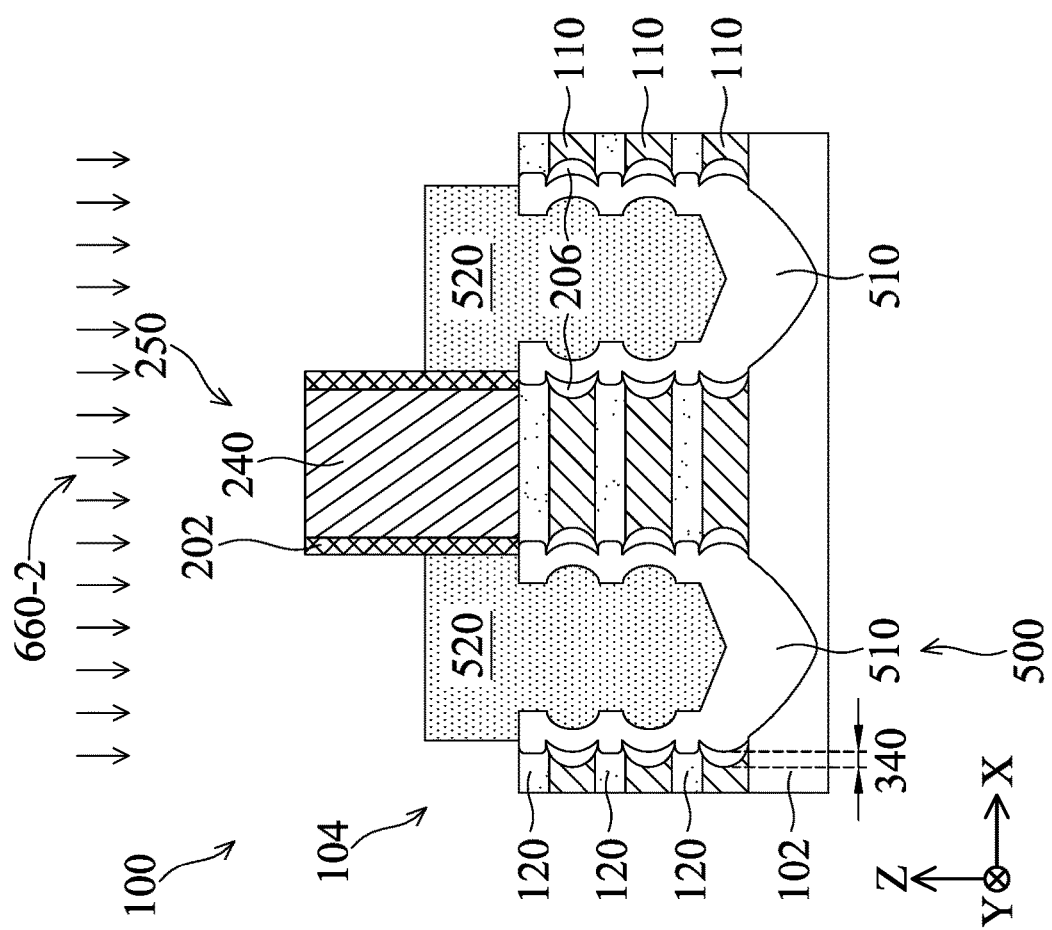
Figure 11:
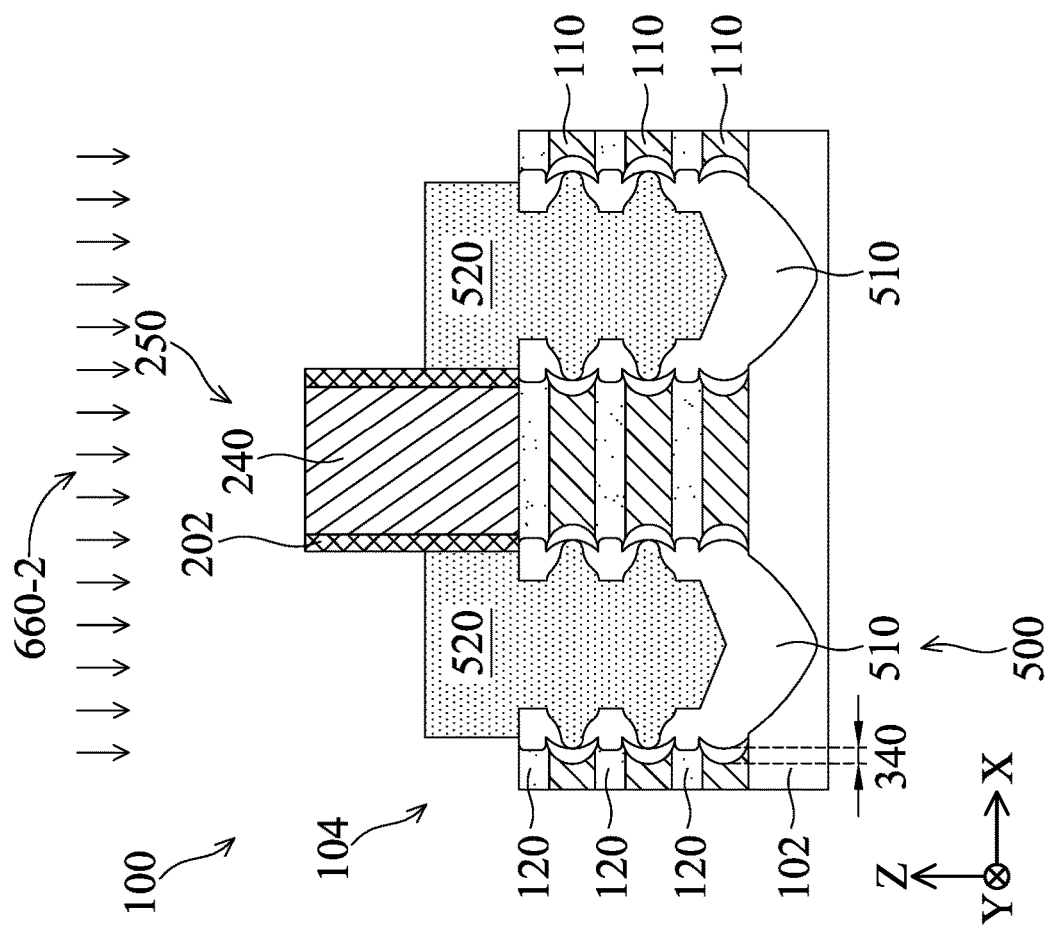

As illustrated in FIGS. 10, and 11, the method 10 proceeds to forming epitaxial source/drain features 500 in the source/drain trenches 208, and at least partially fill the source/drain trenches 208 as well as the openings 207. The epitaxial source/drain features 500 may include more than one layers formed in different portions of the source/drain trenches 208. In the embodiments depicted in FIG. 11, the epitaxial source/drain features 500 includes two epitaxial layers 510 and 520, where the epitaxial layer 510 directly interfaces with the substrate in the trench portions 204b (see FIG. 5), as well as with the etched sidewall surfaces 430 of the semiconductor layers 120. The epitaxial layer 520 is then formed over and between portions of epitaxial layer 510. The epitaxial layers 510 and 520 are interchangeably referred to as source/drain layers or epitaxial source/drain layers 510 and 520, respectively. In some embodiments, the epitaxial layers 510 and 520 each fulfill certain different functions, as further described below.

Referring to block 26 of FIG. 2B and FIG. 10, epitaxial layers 510 are formed in the source/drain trenches 208 via epitaxial process 660-1. In the depicted embodiments, the epitaxial layers 510 do not entirely fill the source/drain trenches 208. Rather, the epitaxial layers 510 form a "U"-shaped layer on sidewall surfaces and the bottom surface of the source/drain trenches 208. For example, the epitaxial layer may have two prong portions 510p and a bottom portion 510b. As shown in FIG. 10, the adjacent bottom portions 510b are interposed by a portion of substrate below the lowest semiconductor layer 120 (or the channel layers 120). This portion of substrate may also function as a channel during the operation, and is therefore referred to herein as the bottom channel 122. However, the gate control of this portion is substantially weaker than that of the suspended channel layers 120 (which are entirely surrounded by portions of the gate structures 250). Accordingly, charge migrations between the bottom portions 510b through this portion of substrate may undesirably occur even when the device is switched off (e.g. when there is no applied voltage or when the applied voltage is below the threshold voltage). As described later, the bottom portions 510b are configured to result in a relatively low charge carrier mobility, thereby addressing the leakage issue. In some embodiments, the bottom portion 510b fills the entirety of the trench portions 204b. For example, the top surface of the bottom portions 510b each extend along or higher than the top surface of the substrate 102. If the top surface of the bottom portion extends too low, subsequently formed epitaxial layers having charge carriers with high migration mobility may be too close to the bottom channel, raising OFF-state leakage risks. Meanwhile, the top surface of the bottom portion 510b each extend along or lower than the bottom surface of the lowest semiconductor layer 120. If the top surface extends too high, some portions of the channel layers 120 may not have sufficient amount of charge carriers of high mobility (such as those provided by the subsequently formed epitaxial layer 520). Accordingly, operational current may be unnecessarily limited.

The two prong portions 510p each directly interfaces with the semiconductor layers 120 and further directly interfaces with the inner spacers 206. In some embodiments, the top surfaces of the prong portions 510p reach or extend beyond a top surface of the topmost semiconductor layers 120. The prong portions may have varying thicknesses along its profile. Moreover, the prong portions may have reduced lateral thickness along the X-direction as compared to the bottom portion of the epitaxial layer 510 (e.g. the portion connecting the two prong portions). As illustrated in FIG. 10, the prong portions 510p each have multiple sections (or "extensions") between vertically adjacent inner spacers 206 and between the top inner spacer 206 and the gate structure 240. Moreover, the epitaxial layers 510 have additional sections on sidewall surfaces of the inner spacers 206. These sections are physically interconnected, and connected to the bottom portion 510b, so as to form a continuous epitaxial layer 510 covering the exposed surfaces of the source/drain trenches 208. More details of the structures and parameters are described in detail later with respect to FIGS. 13A and 13B.

Generally, the growth of the semiconductor epitaxy initiates from surfaces of the semiconductor materials and does not initiate from dielectric materials. At the beginning of the epitaxial process 600-1, the sidewall surfaces 430 of the semiconductor layers 120 in the openings 207, as well as the top surfaces of the substrate 102 in the source/drain trenches 208, are exposed in the source/drain trenches 208. Accordingly, the growth of the epitaxial layer 510 initiates vertically from the top surfaces of the substrate 102, and laterally from the surfaces 430 in the openings 207. Minimal (if any at all) growth occurs from the dielectric material of the inner spacers 206. In some embodiments however, growth fronts of the epitaxy process from adjacent surfaces eventually merge on surfaces of the inner spacers 206, following sufficient growth time, to form continuous epitaxial layers 510 thereon. Accordingly, at the conclusion of the epitaxial process 600-1, the epitaxial layer 510 directly interfaces with the semiconductor layers 120 on the sidewall surfaces 430; and further directly interfaces with the inner spacers 206 at not only the sidewall surfaces 420, but also on bottom surfaces 432 and top surfaces 434. In other words, the epitaxial layers 510 wrap around the inner spacers 206 along with the remaining portions of the semiconductor layers 110 (which is later replaced with metal gate structures). Accordingly, portions of the epitaxial layers 510 extend along the top, bottom, and sidewall surfaces of the inner spacers 206.

The epitaxial process 660-1 may include performing an epitaxial deposition/partial etch process and repeating the epitaxial deposition/partial etch process. Accordingly, the epitaxial process 660-1 is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial process 660-1 may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer 510 is reached. In some embodiments, the epitaxial process 660-1 may instead be a selective epitaxial growth (SEG) process. The selective epitaxial growth process utilizes simultaneous deposition and etch operations. In some embodiments, the epitaxial process 600A-1 may include both CDE operations and SEG operations.

In the depicted embodiments, the device 100 is configured as an n-type device. Accordingly, the epitaxial layers 510 include n-type semiconductor materials, such as silicon. Therefore, the epitaxial processes 660-1 may implement at least one silicon-containing precursor, such as silane ($SiH_4$), disilane ($Si_2H_6$), trisilane ($Si_3H_8$), dichlorosilane ($SiH_2Cl_2$), another silicon-containing precursor, or any combinations thereof. Furthermore, the epitaxial layers 510 includes a dopant element. The doping improves the mobility of charge carriers that migrate from one epitaxial layer 510 through the semiconductor layers 120 to another epitaxial layer 510 during operation. For example, the dopant may include Arsenic (As), phosphorous (P), antimony (Sb), bismuth (Bi), or combinations thereof. In some embodiments, the dopants are configured to have a type and concentration that achieves a relatively low charge carrier mobility (for example, lower than that in the subsequently formed epitaxial layers 520). If the charge carrier mobility is too large, such as greater than that in the subsequently formed epitaxial layer 520 (as described in detail later), charge carriers may migrate through the bottom channel at an unacceptably high speed, causing substantial leakage current in the OFF state. However, charge carrier mobility that is too low may cause high resistance for current flowing through the epitaxial layer 510 into the higher channels, thereby adversely affect the device performances. In some embodiments, the charge carrier mobility is controlled by the concentration of the dopant elements. For example, the dopants may be configured to be at a concentration of about $1 \times 10^{19}$ atoms/$cm^3$ to about $9 \times 10^{20}$ atoms/$cm^3$. If the dopant concentration is too small, such as less than about $1 \times 10^{19}$ atoms/$cm^3$, or too large, such as greater than about $9 \times 10^{20}$ atom/$cm^3$, the target charge carrier mobility may not be achieved.

The dopant may be introduced by dosing a precursor having the dopant element along with the Si-containing precursors during the epitaxial process 660-1. For example, to introduce an As dopant, As-containing precursors may be introduced during the epitaxial processes 660-1. As-containing precursors include arsine ($AsH_3$), arsenic nitride ($AsN_3$), $As_xHe$, other suitable As-containing precursors, or combinations thereof. In some embodiments, the dopant precursor may be introduced at a percentage of about 10% to about 30%. If the percentage is too low (such as less than 10%) or too high (such as greater than 30%), the target concentration of the dopant may not be achieved. Alternatively, the dopant element may be introduced after the formation of the epitaxial layers 510, such as via an implant process (such as a tilt-angle ion implantation process) or a diffusion process. The epitaxial layers 510 may include any suitable dopant profiles. The dosage of the precursors may be adjusted throughout the epitaxial process 660-1 to achieve the desired dopant profile. In some embodiments, annealing operations are performed to cure any defects produced during the implant process. In some embodiments, annealing operations are performed to further activate the dopant element. The annealing process may be rapid thermal annealing (RTA) process, a laser annealing process, other suitable annealing process, or combinations thereof.

Referring to block 28 of FIG. 2B and to FIG. 11, epitaxial layers 520 are formed on top and sidewall surfaces (or inner surfaces) of the epitaxial layer 510 in epitaxial processes 660-2. Accordingly, the epitaxial layer 520 has a bottom surface that extend below the bottom surface of the lowest channel layer 120 and above the top surface of the substrate 102. Moreover, the epitaxial layer 520 connect the two prong portions 510p and fills at least majority of the remaining portions of the source/drain trenches 208. In some embodiments, the epitaxial layer 520 completely fills the source/drain trenches 208. Furthermore, epitaxial layer 520 is formed over a continuous epitaxial layer 510 (see FIG. 10). Accordingly, the epitaxial layer 520 is spaced away from the inner spacers 206 throughout its profile.

As described above, the epitaxial layers 520 are designed to have substantially greater charge carrier mobilities than the epitaxial layer 510 has, such that operational current and device speeds are optimized. The epitaxial layers 520 may include any suitable epitaxial materials. In the depicted embodiment, the epitaxial layers 520 are configured to form part of an epitaxial source/drain features 500 of an NMOS. Accordingly, epitaxial layers 520 include epitaxial materials suitable for an NMOS, such as silicon. In some embodiments, the semiconductor epitaxy of the epitaxial layers 520 may be the same as that of the epitaxial layers 510. For example, the epitaxial layers 520 may include Si as the semiconductor epitaxy. Moreover, the epitaxial layers 520 may include an n-type dopant, such as P, As, Bi, Sb, or combinations thereof. In some embodiments, epitaxial layers 520 may include a same dopant as the epitaxial layers 510. For example, both the epitaxial layers 510 and 520 include P. In other words, both epitaxial layers 510 and 520 may be epitaxial silicon: phosphor (Si: P) source/drain layers. The epitaxial layers 520 may include the dopant at different concentrations to achieve the different charge carrier mobility. As described above, the epitaxial layers 510 may include the dopant at a concentration of $1 \times 10^{19}$ atoms/$cm^3$ to about $9 \times 10^{20}$ atoms/$cm^3$. The epitaxial layers 520 may include the dopant at a concentration of $1 \times 10^{20}$ atoms/$cm^3$ to about $9 \times 10^{21}$ atoms/$cm^3$. If the dopant concentration is too small, such as less than about $1 \times 10^{20}$ atoms/$cm^3$, the operation current may be unnecessarily limited; if the dopant concentration is too large, such as greater than about $9 \times 10^{21}$ atom/$cm^3$, leakages may result or the increase in speed may saturate. In some embodiments, both epitaxial layers 510 and 520 include the same dopant, and the ratio of the dopant concentration in the epitaxial layers 510 to that in the epitaxial layers 520 may be about 1.1:1 to about 50:1. If the ratio is too small (such as less than 1.1:1) or too large (such as larger than 50:1), the balance between the charge carrier mobilities described above may not be achieved. In some embodiments, both the epitaxial layers 510 and 520 may include As thereby forming epitaxial silicon: arsenic (Si: As) source/drain layers. In some embodiments, the epitaxial layers 520 may include a different dopant from the epitaxial layers 510. For example, the epitaxial layers 510 may include As, while the epitaxial layers 520 may include P.

The epitaxial layers 520 may be formed using similar methods as those described above for the epitaxial layers 510. For example, CDE, SEG, or combinations thereof may be used. Additionally, precursors that include dopant element may be introduced during the deposition cycles of the CDE or SEG processes. For example, P-containing precursors include phosphine ($PH_3$), phosphorous nitride ($PN_3$), phosphorous fluoride ($PF_2$), $P_xHe$, other suitable P-containing precursors, or combinations thereof. In some embodiments, the dopant precursor may be introduced at a percentage of about 30% to about 80%. If the percentage is too low (such as less than 30%) or too high (such as greater than 80%), the target concentration of the dopant may not be achieved. Alternatively, the dopant element may be introduced after the formation of the epitaxial layers 520, such as via an implant process (such as a tilt-angle ion implantation process) or a diffusion process. In some embodiments, annealing operations are performed to cure any defects produced during the implant process. In some embodiments, annealing operations are performed to activate the dopant element. The annealing process may be rapid thermal annealing (RTA) process, a laser annealing process, other suitable annealing process, or combinations thereof.

While the disclosure above describes each of the epitaxial layers 510 and 520 having a single dopant element, in some embodiments, combinations of dopant elements may be used in order to achieve the desired mobility cascade. For example, one or more of the epitaxial layers 510 and 520 may be doped with both As and P to achieve the described mobility cascade. Moreover, additionally or alternatively, the epitaxial layers 510 and 530 may include the same or different dopant(s) at different concentrations (such as atomic percentages) in order to achieve the described mobility cascade. This present disclosure contemplates any dopant structure that achieves the described mobility differences.

Figure 12:
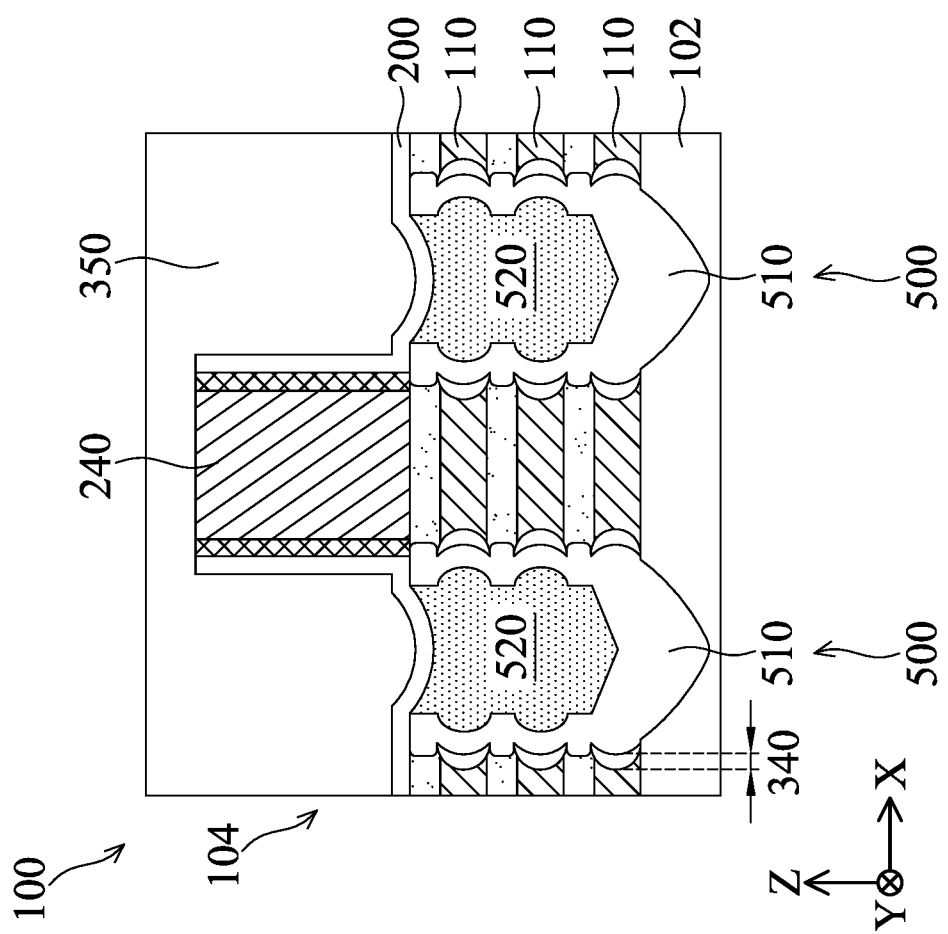
Figure 12:
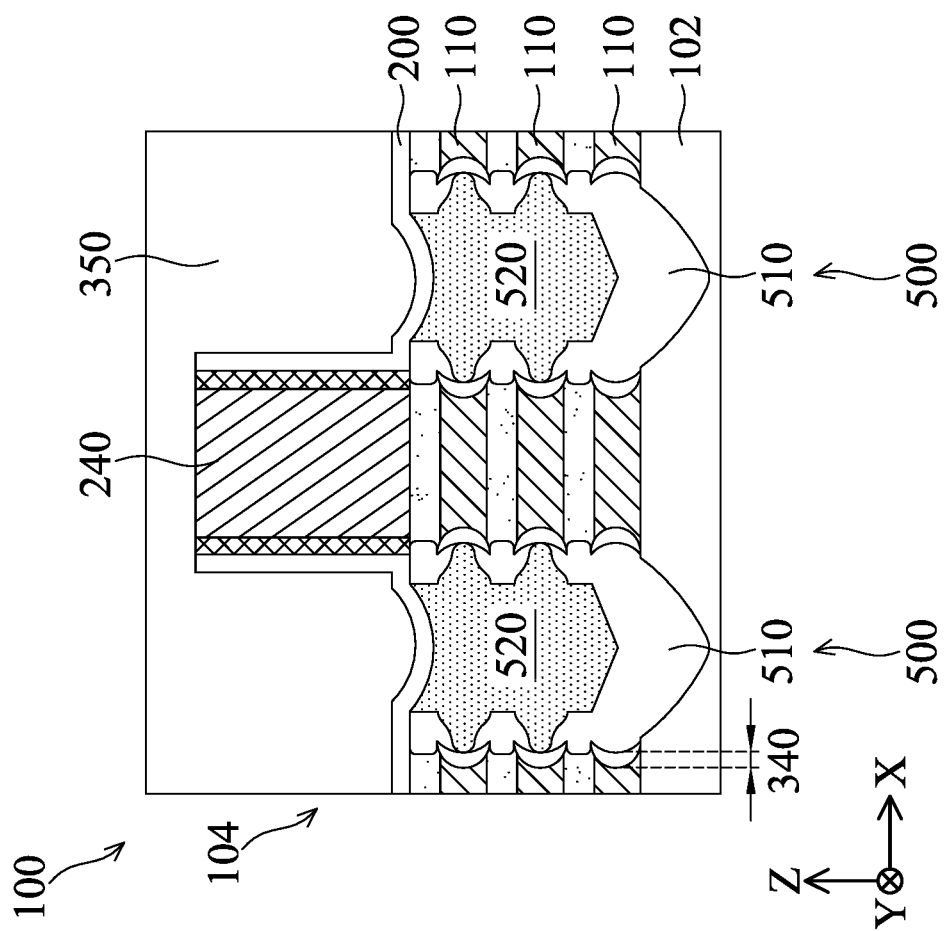
Figure 13A:
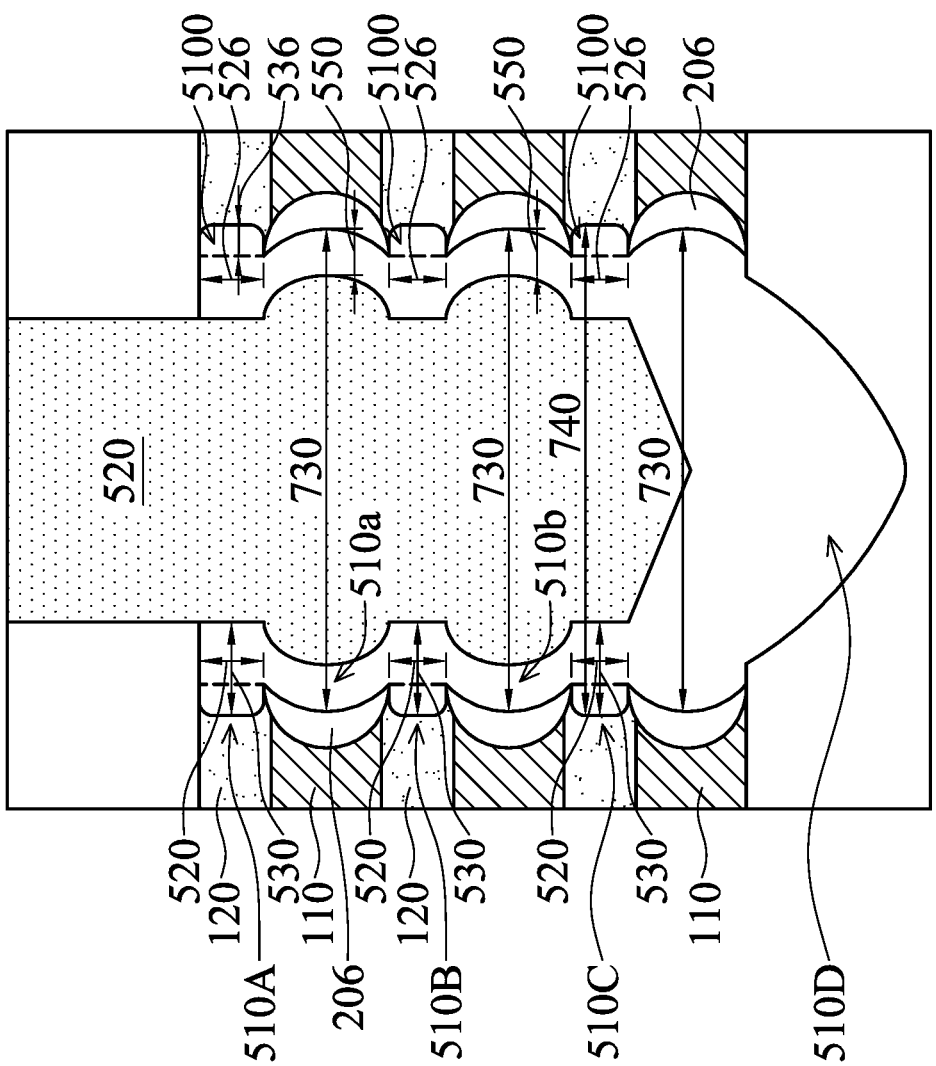
FIGS. 13A and 13B are expanded cross-sectional views of a portion of the nano-sheet-based devices of FIG. 12, according to some embodiments of the present disclosure.
Figure 13B:
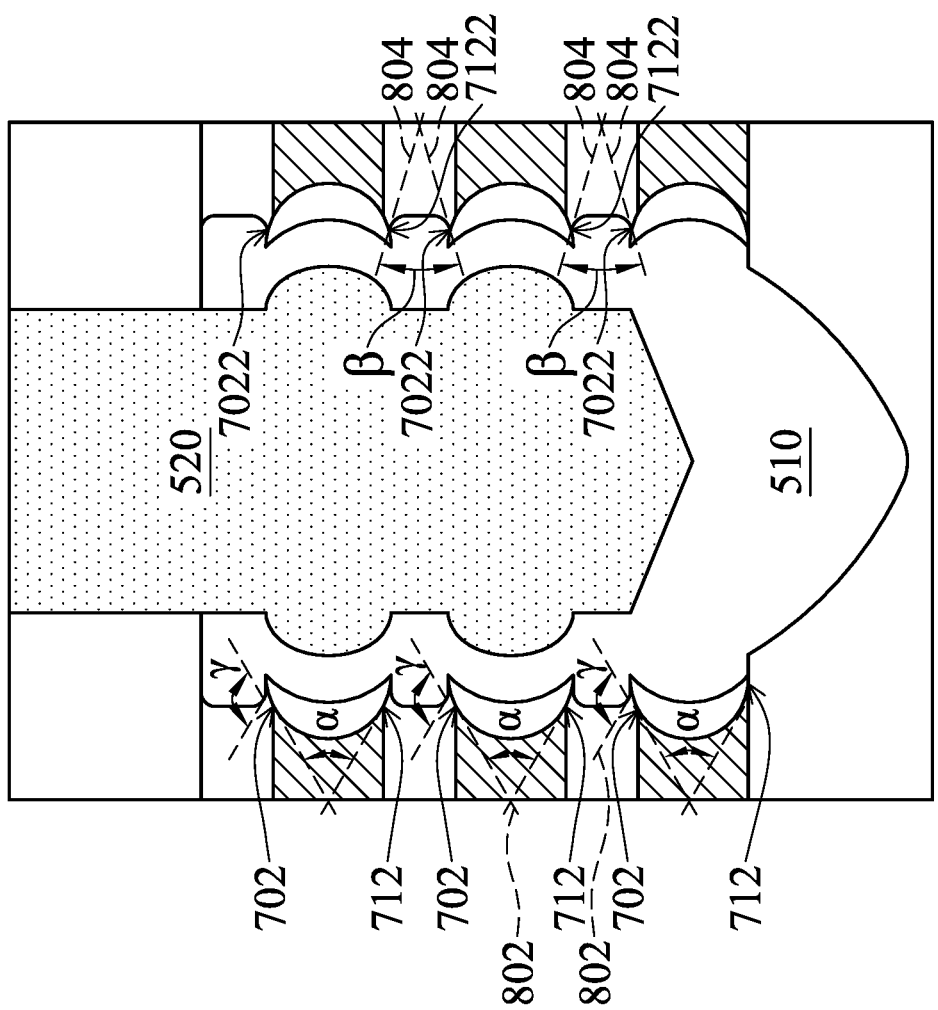
Figure 13A:
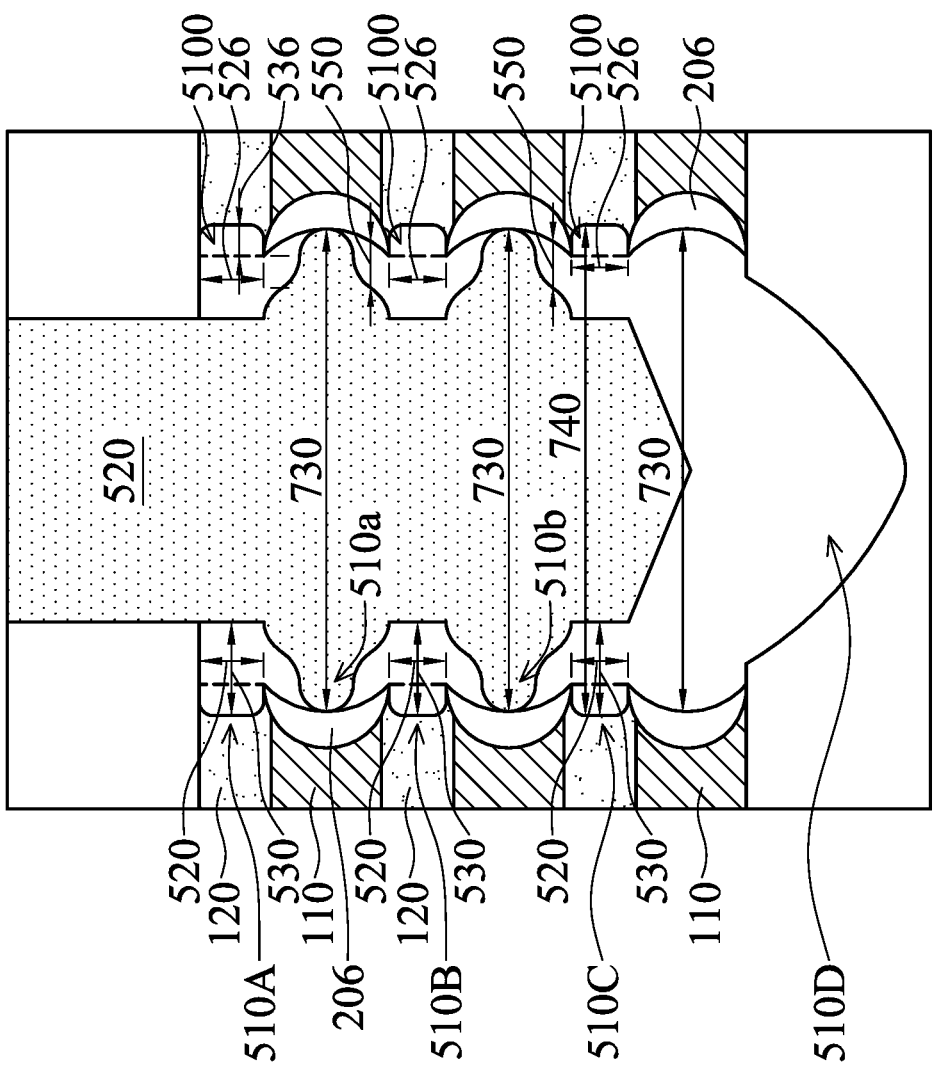
Figure 13B:
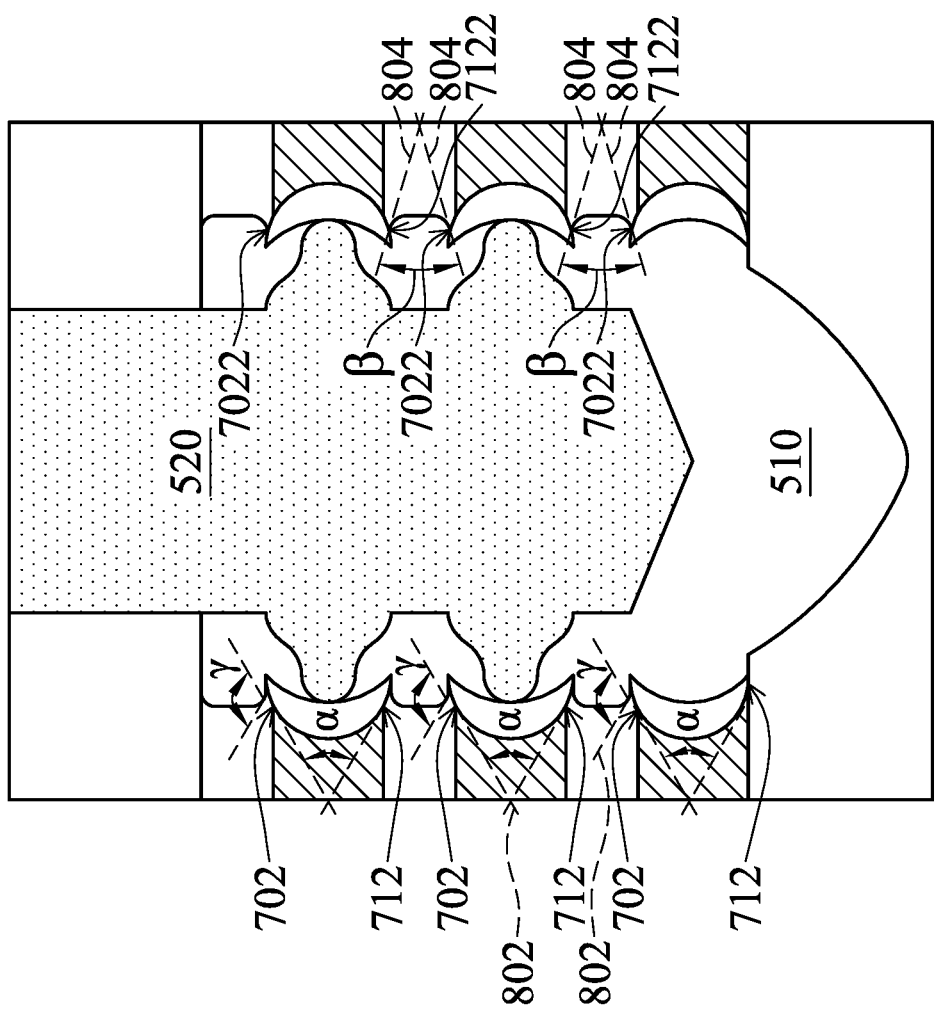

Referring to FIG. 12, an interlayer dielectric (ILD) layer 350 is formed over the epitaxial source/drain features 500, as well as vertically over the isolation features 150. In some embodiments, an etch-stop layer 220 may be formed in between the ILD layer 350 and the source/drain features 500. The ILD layer 350 may also be formed in between the adjacent gate structures 250 along the X-direction, and in between the adjacent epitaxial source/drain features 500 along the Y-direction. The ILD layer 350 may include a dielectric material, such as a high-k material, a low-k material, or an extreme low-k material. For example, the ILD layer 350 may include $SiO_2$, SiOC, SiON, or combinations thereof. The ILD layer 350 may include a single layer or multiple layers, and may be formed by a suitable technique, such as CVD, ALD, and/or spin-on techniques. After forming the ILD layer 350, a CMP process may be performed to remove excessive ILD layer 350 and planarized the top surface of the ILD layer 350. Among other functions, the ILD layer 350 provides electrical isolation between the various components of the device 100.

As illustrated in FIG. 11, each pair of epitaxial layers 510 (hence also the epitaxial source/drain features 500) are connected by multiple semiconductor layers 120, which serve as the charge carrier conduit (or channel layers) between the source side and the drain side during the operation. For example, when the device 100 is switched on (e.g. when the voltage applied to its gate electrode exceeds the threshold voltage), the semiconductor layers 120 electrically connects (or bridges) the epitaxial layers 510 to allow current to be formed. Meanwhile, while the epitaxial layers 520 are physically spaced away from the semiconductor layers 120, they become electrically connected to the semiconductor layers 120 through the epitaxial layers 510. For example, charge carriers migrate from the epitaxial layers 520 on the source side through the epitaxial layers 510 into the semiconductor layers 120, and further from the semiconductor layers 120 through the epitaxial layers 510 into the epitaxial layers 520 on drain side. Because of the implementation of process 650, the semiconductor layers 120 have a smaller length as compared to other approaches not implementing methods of the present disclosure. As a result, the migration distance for charge carriers through the channels and between the source features and the drain features are reduced. This contributes to a faster device. Meanwhile, the source/drain features 500 on both ends of the channels also have a larger volume, as compared to those approaches, with majority of the increase in the volume being the increase in the epitaxial layer 520 having the high charge carrier mobility. As a result, the concentration of the charge carriers with high mobility increases. All these factors lead to reduced time for charge carriers to migrate through the channel layers 120 and complete the circuit. In other words, the apparent mobility of the charge carriers increases, and the device performances (such as speeds) improve.

Moreover, because the semiconductor layers 120 are each surrounded by a portion of the gate structure (described in detail later) in 360°, they are subject to effective gate controls. Accordingly, when the device 100 is switched off, these channel layers are effectively shut off. There may be minimal (or no) charge carriers travelling through the semiconductor layers 120 between the upper portions of the epitaxial layers 510 and 520, despite them being physically adjacent or connected to the semiconductor layers 120. Meanwhile, the bottom channel 122 may be under weak gate control. It is physically separated from the epitaxial layers 520 and not affected by the high charge carrier mobility therein. The immediately connected epitaxial layers 510 have smaller charge carrier mobility. Accordingly, there may be minimal (or no) charge carrier transportation through the bottom channel 122 or any channel layers 120. Leakage current is thereby minimized.

FIGS. 13A and 13B illustrate an expanded cross-sectional view of the source/drain features 500. The prong portions 510p each have different dimensions at different locations of the source/drain features 500. As illustrated in FIG. 13A, the prong portions 510p each includes the top section 510A, directly interfacing with the topmost semiconductor layer 120, the middle section 510B, directly interfacing with the middle semiconductor layer 120, the lower section 510C, directly interfacing with the lower semiconductor layer 120. The sections 510A, 510B, and 510C are sequentially connected, and further connected to the bottom portion 510b which directly interfaces with the bottom channel 122 (see FIGS. 10 and 10'). The sections 510A, 510B, 510C may each have a vertical dimension 520 and a lateral dimension 530. As depicted in FIG. 13A, the epitaxial layer 510 may have curved top, bottom, and/or sidewall surfaces. Accordingly, the dimensions referenced herein may be the average dimensions across the profile of the respective sections of the epitaxial layer 510. Moreover, although not specifically indicated, the sections 510A, 510B, 510C may have the same or different dimensions. Accordingly, the dimensions 520 and 530 referenced herein may further be the average dimensions among the sections 510A, 510B, and 510C. Furthermore, in the depicted embodiments of FIG. 13A, the epitaxial layer 510 includes sections on sidewall surfaces of the inner spacers 206, such as sections 510a that bridge the top sections 510A and the middle sections 510B, as well as the sections 510b that bridge the lower sections 510C and the middle sections 510B. The sections 510a and 510b may have a lateral dimension 550 (along the X-direction) at the mid-height level of the corresponding inner spacers 206 (for example, at the mid-point of the height dimension of the corresponding inner spacers 206 along the Z-direction). The dimension 550 may be substantially smaller than that lateral dimension 530. In some embodiments, the ratio of the dimension 530 to the dimension 550 may be about 1:1 to about 50:1.

As described above, the prong portions 510p of the epitaxial layer 510 each include a plurality of extension segments 5100 that protrude out from the "U". These extension segments 5100 are each surrounded, on their respective top and bottom surfaces, by the inner spacers 206, as well as, on the respective side surfaces, by the semiconductor layer 120. These extension segments 5100 are part of the respective portions 510A, 510B, or 510C. For example, the extension segments 5100 have lateral dimensions 536 (along the X-direction), which is less than the lateral dimensions 530 of the respective portions 510A, 510B, or 510C. The epitaxial layer extension 5100 further have vertical dimensions 526 (along the Y direction), which may be about the same as the lateral dimension 520 of the respective portions 510A, 510B, or 510C. Similar to what described above, the extension segments 5100 may each have curved top, bottom, and sidewall surfaces, and may have different dimensions among each other. Accordingly, the dimensions 526 and 536 referenced herein are averaged dimensions. In some embodiments, the vertical dimensions 526 may be about 4 nm to about 16 nm; while the lateral dimensions 536 may be about 1 nm to about 10 nm. In some embodiments, the lateral dimensions 536 are less than the lateral dimension 340 of the inner spacers 206. Therefore, each pair of vertically adjacent inner spacers 206 are interposed by not only the epitaxial layer extensions 5100, but also a portion of the semiconductor layers 120.

The top sections 510A may have a profile that includes a bulk part between the sidewall surfaces of the semiconductor layers 120 and the sidewall surfaces of the epitaxial layer 520, and a tail part between the sidewall surfaces of the inner spacers 206 and sidewall surfaces of the sidewall surfaces of the epitaxial layer 520. The tail part may be part of the section 510a described above with respect to FIG. 13A. Similarly, the middle section 510B may have a profile that includes a bulk part, and two tail sections between the sidewall surfaces of the inner spacers 206 and sidewall surfaces of the epitaxial layer 520. The two tail parts may each be part of the sections 510a and 510b described above with respect to FIG. 13A. Furthermore, the lower section 510C also may have a profile that includes a bulk part, and a tail part between the sidewall surfaces of the inner spacers 206 and sidewall surfaces of the sidewall surfaces of the epitaxial layer 520. The tail part may be part of the section 510b described above with respect to FIG. 13A. The tail parts of adjacent sections 510A, 510B, and/or 510C are connected between each other. Further, the lower section 510C further includes another tail part that connects with the bottom section 510b. Each of the tail parts directly interfaces with the epitaxial layer 520 as well as directly interfaces with the inner spacers 206.

Referring to FIG. 13B, the inner spacers 206 have a curved sidewall surface 410. The epitaxial layer extension 5100 also each have curved surfaces, such as sidewall surfaces 430, curved top surfaces 432, and curved bottom surfaces 434. In some embodiments, a curvature of the sidewall surfaces 430 is less than the curvature of the sidewall surfaces 410 of the inner spacers 206. The curvature may be quantified by angles spanned by tangential lines at certain locations of the features. For example, the inner spacers 206 may have an interface line 7022 with a sidewall surface 430 of an overlaying epitaxial layer extension 5100, and have an interface line 7122 with a sidewall surface 430 of an underlaying epitaxial layer extension 5100. The inner spacers 206 may have tangential lines 802 at the interface lines 7022 and 7122, which spans an angle α therebetween. In some embodiments, the angle α may be about 30° to about 70°. The epitaxial layer extension 5100 may have tangential lines 804 at the interface lines 7022 and 7122, which spans an angle β therebetween. In some embodiments, the angle β may be about 30° to about 90°. In some embodiments, the angle β is greater than the angle α. Moreover, the epitaxial layer extensions 5100 each have an angle γ spanned between the tangential line 802 and the tangential line 804. In some embodiments, the angle γ may be about 90° to about 170°. In other approaches without implementing methods and structures of the present disclosure, the sidewall surfaces 420 and 430 face opposite directions. Accordingly, in such approaches, the angle γ may be less than about 90°. Different inner spacers 206 and/or different epitaxial layer extensions 5100 may have the same or different angles α, β, and/or γ. Accordingly, the angles α, β, and γ referenced herein are averaged between all relevant angles associated with the same source/drain feature 500.

FIGS. 10-12, 13A, and 13B illustrate the embodiments where the epitaxial process 600-1 is configured to be terminated after growth fronts of the epitaxial layer 510 merge on sidewall surfaces of the inner spacers 206. As a result, the epitaxial layer 510 covers the entire sidewalls of the inner spacers 206 (and the entire sidewalls of the source/drain trenches 208). Alternatively, referring to FIG. 10', the epitaxy process 660-1 may be terminated before merging on sidewall surfaces of the inner spacers 206 occurs. In other words, at the conclusion of the epitaxy process 660-1, the growth fronts from adjacent portions of the epitaxial layer 510 have not merged and remain spaced away from each other in an area adjacent to the sidewall surfaces 420 of the inner spacers 206. As a result, the epitaxial layer 510 may include a plurality of discrete portions (or islands) separated from each other. For example, the previously described top portions 510A, middle portions 510B, and lower portions 510C are disconnected from each other along the Z-direction. Moreover, the tail parts of the portions 510A, 510B, and 510C are not connected with each other. In other words, openings 207 are not filled entirely. Rather, gaps 210 remain and interpose between and separate vertically adjacent sections of the epitaxial layers 510. Therefore, a portion of the sidewall surfaces of the inner spacers 206 are exposed in gaps 210.

Referring to FIG. 11', the epitaxial layer 520 is formed over the discontinuous epitaxial layer 510. Similar to the growth of the epitaxial layer 510, the epitaxial layer 520 grows from the semiconductor materials on the surfaces of the discrete portions of the epitaxial layers 510. Eventually, growth fronts of the epitaxial layer 520 merge on the sidewall surfaces of the inner spacers 206, and fills the gaps 210. Rather, adjacent tail parts are interposed along the Z-direction by a tip portion of the epitaxial layer 520. In such embodiments, tip portions of the epitaxial layer 520 each extend between adjacent tail parts of the portions 510A, 510B, and 510C, such that the tip portions of the epitaxial layer 520 directly interface with the inner spacers 206 on sidewall surfaces 420. Such interfaces between the inner spacers 206 and the epitaxial layer 520 are located in a region vertically between two adjacent tail parts of adjacent portions of the epitaxial layer 510.

Referring to FIG. 12', an ILD layer 350 is formed over the device 100. FIG. 12' substantially resembles the FIG. 12 with the exception that the epitaxial layers 510 are discontinuous in FIG. 12'. Furthermore, details of the source/drain features 500 are illustrated in FIGS. 13A' and 13B'. FIGS. 13A' and 13B' resemble FIGS. 13A and 13B, respectively, with the exception that the epitaxial layers 510 are discontinuous, and that tips of the epitaxial layers 520 directly contacts the inner spacers 206.

While the disclosure above provides two epitaxial layers 510 and 520, more epitaxial layers may be implemented to better control the cascade of the charge carrier mobilities in different regions of the source/drain features.

Figure 14:
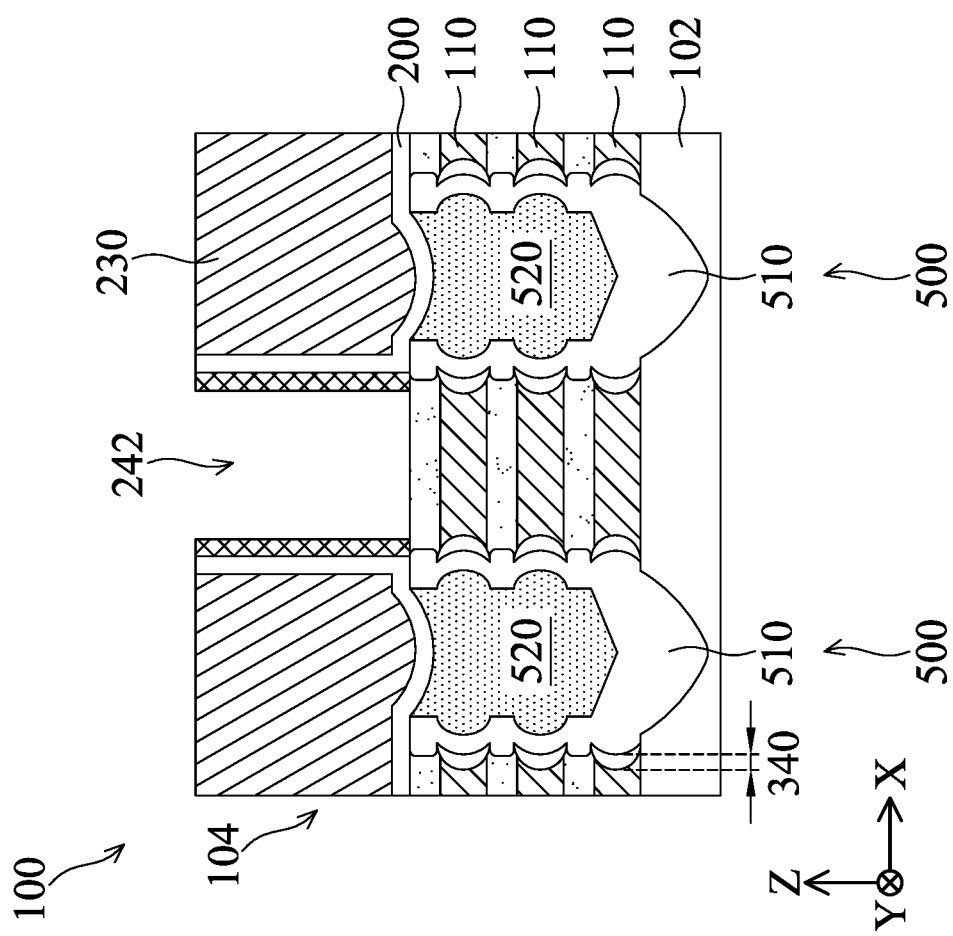
Figure 15:
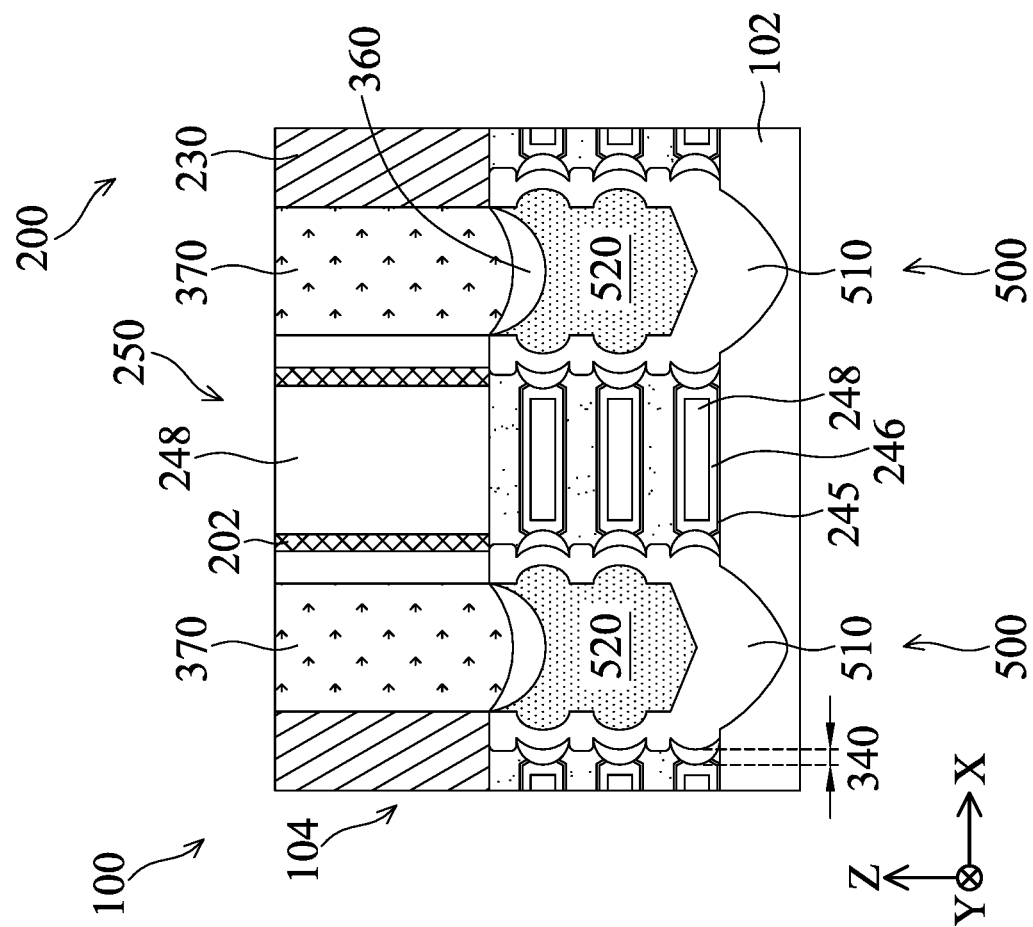
Figure 15:
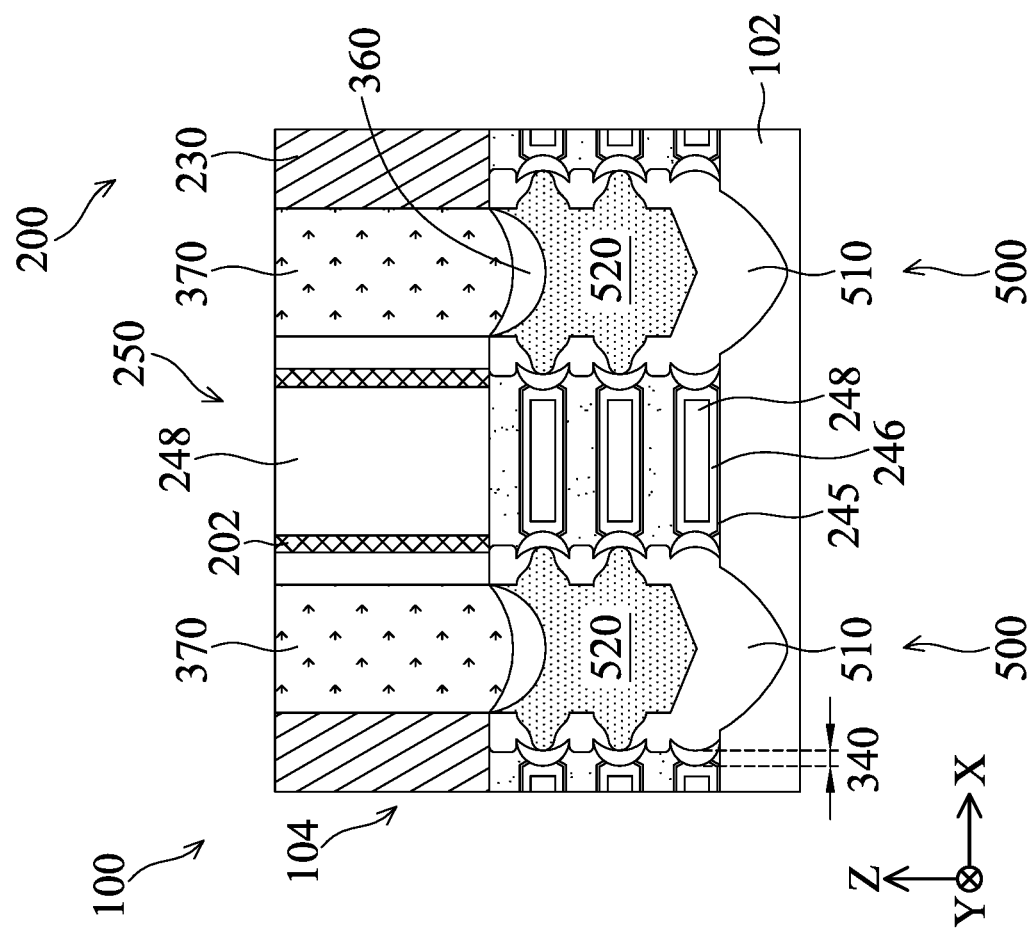

FIGS. 14 and 15 illustrate subsequent processes using the embodiments shown in FIG. 12 as an example. Similar processes may be implemented for embodiments shown in FIG. 12' as well. Referring to block 30 of FIG. 2B and FIG. 14, the dummy gate stacks 240 are selectively removed. The removal of the dummy gate stacks 240 creates gate trenches 242, which expose the respective top surfaces and the side surfaces of the semiconductor stacks (along the Y direction). The removal processes may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer layers 202 may be used as the masking element or a part thereof.

Referring to blocks 32 of FIG. 2B and FIG. 15, the remaining portions of the semiconductor layers 110 are selectively removed through the exposed side surfaces of the semiconductor stack. Similar to processes 620, this process may be configured to completely remove the semiconductor layers 110 without substantially affect the semiconductor layers 120. Nevertheless, the semiconductor layers 120 may be slightly affected during the process. For example, the center of the semiconductor layers 120 may have their thicknesses reduced by about 1% to about 10%. The removal of the remaining portions of the semiconductor layers 110 form suspended semiconductor layers 120, as well as openings in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The semiconductor layers 120 are now "suspended" semiconductor layers 120. This processes may implement any suitable etching methods, such as a dry etching method, a wet etching method, or combinations thereof. In addition to exposing top and bottom surfaces of the center portions of the semiconductor layers 120, the processes also expose the sidewall surfaces 460 of the inner spacers 206.

Referring to block 34 of FIG. 2B and FIG. 15, metal gate stacks are formed in the gate trenches 242 and openings between suspended semiconductor layers 120. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. The high-k gate dielectric layer 246 may be formed conformally such that it at least partially fills the gate trenches 242 and the openings. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces 410 of the inner spacers 206, and the gate spacer layers 202. The high-k gate dielectric layer 246 may contain a dielectric material having a dielectric constant greater than a dielectric constant of $SiO_2$, which is approximately 3.9. For example, the high-k gate dielectric layer 246 may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof.

In some embodiments, an interfacial layer 245 is formed to interpose between the semiconductor layers 120 and the gate dielectric layers 246. Any suitable methods may be used to form the interfacial layer, such as ALD, CVD, or other deposition methods. Alternatively, the interfacial layer 245 may also be formed by an oxidation process, such as thermal oxidation or chemical oxidation. In this instance, no interfacial layer is formed on the sidewalls of the inner spacers 206 or the gate spacer layers 202. In many embodiments, the interfacial layer 245 improves the adhesion between the semiconductor substrate and the subsequently formed high-k dielectric layer 246. However, in some embodiments, the interfacial layer 245 is omitted.

The conductive metal layer 248 is formed over the gate dielectric layer 246 and fills the remaining spaces of the gate trenches 242 and the openings between suspended semiconductor layers 120. The conductive metal layer 248 may include a work function metal layer. In the depicted embodiment, the conductive metal layer 248 is configured for the NMOS transistor. Accordingly, the work function metal layer may include any suitable n-type work function metal materials, such as titanium nitride (TiN), ruthenium (Ru), iridium (Ir), osmium (Os), rhodium (Rh), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 350. The gate dielectric layer 246 and the conductive metal layer 248 collectively form the high-k metal gate stack. The high-k metal gate stack and the gate spacer layers 202 collectively form the new gate structures 250. The gate structures 250 engage multiple semiconductor layers 120 to form multiple gate channels. Moreover, the semiconductor layers 120 may have a dimension $D_1$ along the X-direction. Meanwhile, the gate structure 250 may have a dimension $D_2$ along the fin direction, and the inner spacers 206 each have a third dimension $D_3$ along the fin direction (e.g. equaling distance 340). In some embodiments, $D_1$ is greater than $D_2$, and $D_1$ is less than $D_2+2D_3$.

Referring to block 36 of FIG. 2B and to FIG. 15, contact trenches are formed over the epitaxial source/drain features 500 in the ILD layer 350. Subsequently, a silicide feature 360 (or silicide layer 360) is formed in the contact trench and on the epitaxial source/drain features 500. Silicide features 360 may reduce Schottky barrier height and thereby reduce the contact resistances between the source/drain features and the subsequently formed contact features. In the depicted embodiments, the silicide features 360 interface with the epitaxial layers 520. The silicide features 360 may be formed using any suitable methods, such as self-aligned silicide method, other suitable methods, or combinations thereof. In some embodiments, the silicide features 360 have a concave surface. In some embodiments, the silicide features 360 are omitted. Furthermore, source/drain contacts 370 are formed over the silicide features 360. The source/drain contacts 370 may include any suitable contact materials, such as tungsten (W), cobalt (Co), aluminum (Al), copper (Cu), or combinations thereof.

Referring to FIG. 15', where the epitaxial layer 510 is formed as discrete portions (see FIGS. 10', 11', 12', 13A', and 13B'), the epitaxial layer 520 directly interfaces with a portion of the inner spacers 206. Such structures are maintained in the final device structure. FIG. 15' is otherwise similar to FIG. 15 described above.

The disclosure above describes forming an NMOS device 100 with improved channel, inner spacer, and source/drain feature structures that provides for reduced leakage current without sacrificing operational current. In some embodiments, the device 100 may alternatively be a PMOS device. In such embodiments, the epitaxial layers 510 (and portions therein) and 520 may have similar physical dimensions, profiles, and parameters as described above with respect to the NMOS device 100. Moreover, the dopant structures may similarly be configured for the epitaxial layers 510 and for the epitaxial layers 520. However, in the case of PMOS devices, the charge carriers are holes rather than electrons. Furthermore, the base material for the charge carriers to migrate within, that is, epitaxial layers 510 and 520 may be different from that in the NMOS device 100. For example, the epitaxial layers 510 and 520 may include suitable p-type semiconductor epitaxy materials, such as Si, silicon germanium (SiGe), germanium (Ge), or combinations thereof. In some embodiments, the epitaxial layers 510 and 520 may include a p-type dopant, such as boron (B), boron fluoride ($BF_2$), gallium (Ga), other suitable p-type dopants, or combinations thereof. In some embodiments, the epitaxial layers 510 for a p-type device may include a boron (B) dopant at a concentration of about $1\times10^{21}$ atoms/cm$^3$ to about $5\times10^{21}$ atoms/cm$^3$atoms/cm$^3$; and epitaxial layers 520 for a p-type device may include a boron (B) dopant at a concentration of about $1\times10^{21}$ atoms/cm$^3$ to about $8\times10^{21}$ atoms/cm$^3$. Such a configuration reduces leakage current in the PMOS device without adversely affecting the device performances. Furthermore, PMOS devices include a gate structure that has similar structures to that of the gate structures 250 described above. However, the conductive metal layer 248 may include a different work function metal layer or a different fill metal layer. For example, the work function metal layer may include p-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. The fill metal layer may include any suitable materials such as Al, W, Cu, Co, Ni, Pt, Ru, or combinations thereof.

In some embodiments, the device 100 may be a CMOS device having an NMOS component and a PMOS component coupled together. In some embodiments, only the NMOS component implements the channel layer, inner spacer, and epitaxial layer structures described herein. In other embodiments, only the PMOS component implements the channel layer, inner spacer, and epitaxial layer structures described herein. In still other embodiments, both NMOS component and PMOS component implement the channel layer, inner spacer, and epitaxial layer structures described herein.

Method 10 above describes example methods of the present disclosure. Processing steps may be added to or eliminated from the methods 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Different embodiments may provide different benefits, and not all benefits are required for any specific embodiment. In an exemplary aspect, the present disclosure is directed to a semiconductor device. The semiconductor device includes a source/drain feature over a semiconductor substrate, channel layers connected to the source/drain feature, a gate structure between adjacent channel layers and wrapping the channel layers, and an inner spacer between the source/drain feature and the gate structure and between adjacent channel layers. The source/drain feature has a first interface with a first channel layer of the channel layer, and the first interface has a convex profile protruding towards the first channel layer.

In some embodiments, the source/drain feature contacts a top surface, a side surface, and a bottom surface of the inner spacer. In some embodiments, the source/drain feature includes a first source/drain layer and a second source/drain layer on the first source/drain layer. Moreover, the first source/drain layer directly contacts the first channel layer, where the first interface is a surface of the first source/drain layer. In some embodiments, the first source/drain layer has a dopant at a first concentration, the second source/drain layer has a dopant at a second concentration, and the first concentration is less than the second concentration. In some embodiments, the second source/drain layer is spaced away from the channel layers. Moreover, the second source/drain layer interfaces with the inner spacer. In some embodiments, the inner spacer has a second interface with the gate structure. The second interface and the first interface face a same direction. In some embodiments, the source/drain feature includes a plurality of portions each contacting a respective channel layer of the channel layers. Each of the plurality of portions includes a bulk part and a tail part. The bulk part has a first lateral dimension along a second direction parallel to a top surface of the substrate, while the tail part has a second lateral dimension along the second direction. Moreover, the first lateral dimension is greater than the second lateral dimension. In some embodiments, the bulk parts and the tail parts each include a dopant at a first concentration. The source/drain feature further includes an inside layer, the inside layer has the dopant at a second concentration. And the second concentration is greater than the first concentration. Furthermore, the inside layer includes tips each interposing vertically adjacent tail parts and directly contacts a respective inner spacer of the inner spacers. In some embodiments, the source/drain feature includes a first portion on a sidewall of the first channel layer and a second portion on a sidewall of a second channel layer of the channel layers. The first portion of the source/drain feature extends continuously to the second portion of the source/drain feature. In some embodiments, a first portion of the inner spacer is between adjacent channel layers along a first direction perpendicular to a top surface of the substrate, and a second portion of the inner spacer is between adjacent portions of the first source/drain layer along the first direction.

In an exemplary aspect, the present disclosure is directed to a semiconductor device. The semiconductor device includes a fin on a semiconductor substrate, a stack of channel layers over the fin, a gate structure on and between the stack of channel layers, inner spacers between the stack of channel layers and on sidewalls of the gate structure, a first epitaxial layer on sidewall surfaces of the channel layers and on sidewall surfaces of the inner spacers, and a second epitaxial layer on and between portions of the first epitaxial layer. The first epitaxial layer extends along top surfaces and bottom surfaces of the inner spacers.

In some embodiments, the first epitaxial layer has a plurality of convex side surfaces. The first epitaxial layer interfaces with the stack of channel layers on the plurality of convex side surfaces. In some embodiments, the first epitaxial layer has a first dopant concentration, the second epitaxial layer has a second dopant concentration, and the first dopant concentration is less than the second dopant concentration. In some embodiments, the first epitaxial layer includes a plurality of extensions between vertically adjacent inner spacers. The plurality of extensions are on the sidewall surfaces of the channel layers. Moreover, the sidewall surfaces of the channel layers are convex and face away from the second epitaxial layer. In some embodiments, the fin extends along a fin direction. The channel layer has a first dimension $D_1$ along the fin direction. The gate structure has a second dimension $D_2$ along the fin direction. The inner spacers each have a third dimension $D_3$ along the fin direction. Moreover, $D_1$ is greater than $D_2$, and $D_1$ is less than $D_2+2D_3$. In some embodiments, the first epitaxial layer includes a plurality of portions each between the second epitaxial layer and a respective channel layer of the channel layers. Each of the plurality of portions includes a bulk part on sidewall surface of the respective channel layer and a tail part on a sidewall surface of an inner spacer of the inner spacers. In some embodiments, the second epitaxial layer interposes between adjacent tail parts.

In an exemplary aspect, the present disclosure is directed to a method. The method includes receiving a semiconductor substrate, and forming a stack of first semiconductor layers and second semiconductor layers over the semiconductor substrate. The first semiconductor layers and the second semiconductor layers have different material compositions. The method also includes forming a gate structure over the stack, removing portions of the stack on two sides of the gate structure, removing end portions of the first semiconductor layers to form first gaps between adjacent second semiconductor layers, forming inner spacers in the first gaps, removing end portions of the second semiconductor layers to form second gaps between adjacent inner spacers, and forming a source/drain feature in the second gaps.

In some embodiments, the forming of the source/drain feature includes forming a first source/drain layer in the second gaps, and forming a second source/drain layer on the first source/drain layer. The first source/drain layer has a first dopant concentration, and the second source/drain layer has a second dopant concentration. The second dopant concentration is greater than the first dopant concentration. In some embodiments, the removing of the end portions of the second semiconductor layers includes altering a convex sidewall profile of the second semiconductor layers into a concave sidewall profile of the etched second semiconductor layers.

The foregoing outlines features of several embodiments so that those skilled in the art may better understand the aspects of he present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a source/drain feature over a semiconductor substrate;
   channel layers connected to the source/drain feature;
   a gate structure between adjacent channel layers and wrapping the channel layers; and
   an inner spacer between the source/drain feature and the gate structure and between adjacent channel layers,
   wherein the source/drain feature has a first interface with a first channel layer of the channel layer, and the first interface has a convex profile protruding towards the first channel layer, and
   wherein a height of the inner spacer is greater than a distance between the adjacent channel layers.

2. The semiconductor device of claim 1, wherein the source/drain feature contacts a top surface, a side surface, and a bottom surface of the inner spacer.

3. The semiconductor device of claim 1, wherein the source/drain feature includes a first source/drain layer and a second source/drain layer on the first source/drain layer,
   wherein the first source/drain layer directly contacts the first channel layer, and
   wherein the first interface is a surface of the first source/drain layer.

4. The semiconductor device of claim 3, wherein the first source/drain layer has a dopant at a first concentration, the second source/drain layer has a dopant at a second concentration, and
   wherein the first concentration is less than the second concentration.

5. The semiconductor device of claim 3, wherein the second source/drain layer is spaced away from the channel layers, and wherein the second source/drain layer interfaces with the inner spacer.

6. The semiconductor device of claim 1, wherein the inner spacer has a second interface with the gate structure, wherein the second interface and the first interface face a same direction.

7. The semiconductor device of claim 1, wherein the source/drain feature includes a plurality of portions each contacting a respective channel layer of the channel layers,
   wherein each of the plurality of portions includes a bulk part and a tail part, the bulk part having a first lateral dimension along a second direction parallel to a top surface of the substrate, the tail part having a second lateral dimension along the second direction, and
   wherein the first lateral dimension is greater than the second lateral dimension.

8. The semiconductor device of claim 7, wherein the bulk parts and the tail parts each include a dopant at a first concentration,
   wherein the source/drain feature further includes an inside layer, the inside layer having the dopant at a second concentration, the second concentration being greater than the first concentration, and
   wherein the inside layer includes tips each interposing vertically adjacent tail parts and directly contacts a respective inner spacer of the inner spacers.

9. The semiconductor device of claim 1, wherein the source/drain feature includes a first portion on a sidewall of the first channel layer and a second portion on a sidewall of a second channel layer of the channel layers, wherein the first portion of the source/drain feature extends continuously to the second portion of the source/drain feature.

10. The semiconductor device of claim 1, wherein a first portion of the inner spacer is between adjacent channel layers along a first direction perpendicular to a top surface of the substrate, and
a second portion of the inner spacer is between adjacent portions of the first source/drain layer along the first direction.

11. A semiconductor device, comprising:
a fin on a semiconductor substrate;
a stack of channel layers over the fin;
a gate structure on and between the stack of channel layers;
inner spacers between the stack of channel layers and on sidewalls of the gate structure;
a first epitaxial layer on sidewall surfaces of the channel layers and on sidewall surfaces of the inner spacers; and
a second epitaxial layer on and between portions of the first epitaxial layer;
wherein the first epitaxial layer extends along top surfaces and bottom surfaces of the inner spacers, and wherein the second epitaxial layer interfaces with a portion of the inner spacers.

12. The semiconductor device of claim 11, wherein the first epitaxial layer has a plurality of convex side surfaces, the first epitaxial layer interfacing with the stack of channel layers on the plurality of convex side surfaces.

13. The semiconductor device of claim 11, wherein the first epitaxial layer has a first dopant concentration, the second epitaxial layer has a second dopant concentration, and the first dopant concentration is less than the second dopant concentration.

14. The semiconductor device of claim 11, wherein the first epitaxial layer includes a plurality of extensions between vertically adjacent inner spacers,
wherein the plurality of extensions are on the sidewall surfaces of the channel layers, and
wherein the sidewall surfaces of the channel layers are convex and face away from the second epitaxial layer.

15. The semiconductor device of claim 11, wherein the fin extends along a fin direction,
wherein the channel layer has a first dimension $D_1$ along the fin direction,
wherein the gate structure has a second dimension $D_2$ along the fin direction,
wherein the inner spacers each have a third dimension $D_3$ along the fin direction, and
wherein $D_1$ is greater than $D_2$, and $D_1$ is less than $D_2+2D_3$.

16. The semiconductor device of claim 11, wherein the first epitaxial layer includes a plurality of portions each between the second epitaxial layer and a respective channel layer of the channel layers, and
wherein each of the plurality of portions includes a bulk part on sidewall surface of the respective channel layer and a tail part on a sidewall surface of an inner spacer of the inner spacers.

17. The semiconductor device of claim 16, wherein the second epitaxial layer interposes between adjacent tail parts.

18. A method, comprising:
receiving a semiconductor substrate;
forming a stack of first semiconductor layers and second semiconductor layers over the semiconductor substrate, the first semiconductor layers and the second semiconductor layers having different material compositions;
forming a gate structure over the stack;
removing portions of the stack on two sides of the gate structure;
removing end portions of the first semiconductor layers to form first gaps between adjacent second semiconductor layers;
forming inner spacers in the first gaps;
removing end portions of the second semiconductor layers to form second gaps between adjacent inner spacers; and
forming a source/drain feature in the second gaps;
wherein the removing of the end portions of the second semiconductor layers includes altering a convex sidewall profile of the second semiconductor layers into a concave sidewall profile of the etched second semiconductor layers.

19. The method of claim 18, wherein the forming of the source/drain feature includes:
forming a first source/drain layer in the second gaps, the first source/drain layer having a first dopant concentration; and
forming a second source/drain layer on the first source/drain layer, the second source/drain layer having a second dopant concentration, the second dopant concentration being greater than the first dopant concentration.

20. The method of claim 18, wherein a height of the inner spacer is greater than a distance between adjacent ones of the second semiconductor layers.

* * * * *